(12) United States Patent
Tsao et al.

(10) Patent No.: US 11,107,810 B2
(45) Date of Patent: Aug. 31, 2021

(54) FIN FIELD EFFECT TRANSISTOR (FINFET) DEVICE STRUCTURE AND METHOD FOR FORMING THE SAME

(71) Applicant: Taiwan Semiconductor Manufacturing Co., Ltd., Hsinchu (TW)

(72) Inventors: Chih-Pin Tsao, Zhubei (TW); Jeng-Ya Yeh, New Taipei (TW); Chia-Wei Soong, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/561,362

(22) Filed: Sep. 5, 2019

(65) Prior Publication Data
US 2020/0091146 A1     Mar. 19, 2020

Related U.S. Application Data

(60) Provisional application No. 62/732,012, filed on Sep. 17, 2018.

(51) Int. Cl.
| | |
|---|---|
| *H01L 27/088* | (2006.01) |
| *H01L 29/78* | (2006.01) |
| *H01L 27/11* | (2006.01) |
| *H01L 29/417* | (2006.01) |
| *H01L 29/66* | (2006.01) |

(Continued)

(52) U.S. Cl.
CPC .. *H01L 27/0886* (2013.01); *H01L 21/823418* (2013.01); *H01L 21/823431* (2013.01); *H01L 21/823475* (2013.01); *H01L 23/535* (2013.01); *H01L 27/1104* (2013.01); *H01L 29/41791* (2013.01); *H01L 29/6653* (2013.01); *H01L 29/6656* (2013.01); *H01L 29/7851* (2013.01)

(58) Field of Classification Search
CPC ............ H01L 27/0886; H01L 27/1104; H01L 29/41791; H01L 29/6653; H01L 29/6656; H01L 29/7851; H01L 21/823418; H01L 21/823431; H01L 21/823475
See application file for complete search history.

(56) References Cited

U.S. PATENT DOCUMENTS

| | | | |
|---|---|---|---|
| 7,968,971 B2 * | 6/2011 | Chung | ................ H01L 29/0804 257/586 |
| 2014/0197456 A1 * | 7/2014 | Wang | ................ H01L 29/66795 257/192 |

(Continued)

*Primary Examiner* — Seahvosh Nikmanesh
(74) *Attorney, Agent, or Firm* — McClure, Qualey & Rodack, LLP

(57) ABSTRACT

A FinFET device structure is provided. The FinFET device structure includes a fin structure formed over a substrate, and the substrate includes a first region and a second region. A gate structure is formed over a fin structure and a first S/D structure has a first volume. A second S/D structure has a second volume, and the second volume is lower than the first volume. A first contact structure is formed over the first S/D structure and a first conductive via is formed over the first contact structure. A power line is formed over the first conductive via, and the power line is electrically connected to the first S/D structure by the first conductive via and the first contact structure.

20 Claims, 21 Drawing Sheets

(51) Int. Cl.
*H01L 21/8234* (2006.01)
*H01L 23/535* (2006.01)

(56) References Cited

U.S. PATENT DOCUMENTS

2017/0141107 A1\* 5/2017 Kim ................ H01L 21/823456
2018/0102363 A1\* 4/2018 Li ................... H01L 21/823864

\* cited by examiner

FIN FIELD EFFECT TRANSISTOR (FINFET) DEVICE STRUCTURE AND METHOD FOR FORMING THE SAME

CROSS REFERENCE TO RELATED APPLICATIONS

This application claims the benefit of U.S. Provisional Application No. 62/732,012, filed on Sep. 17, 2018, which application is hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 5C' shows a cross-sectional representation of the second S/D structure, in accordance with some embodiments of the disclosure.

FIG. 6C' shows a cross-sectional representation of the first S/D structure, in accordance with some embodiments of the disclosure.

DETAILED DESCRIPTION

Figure 1A:
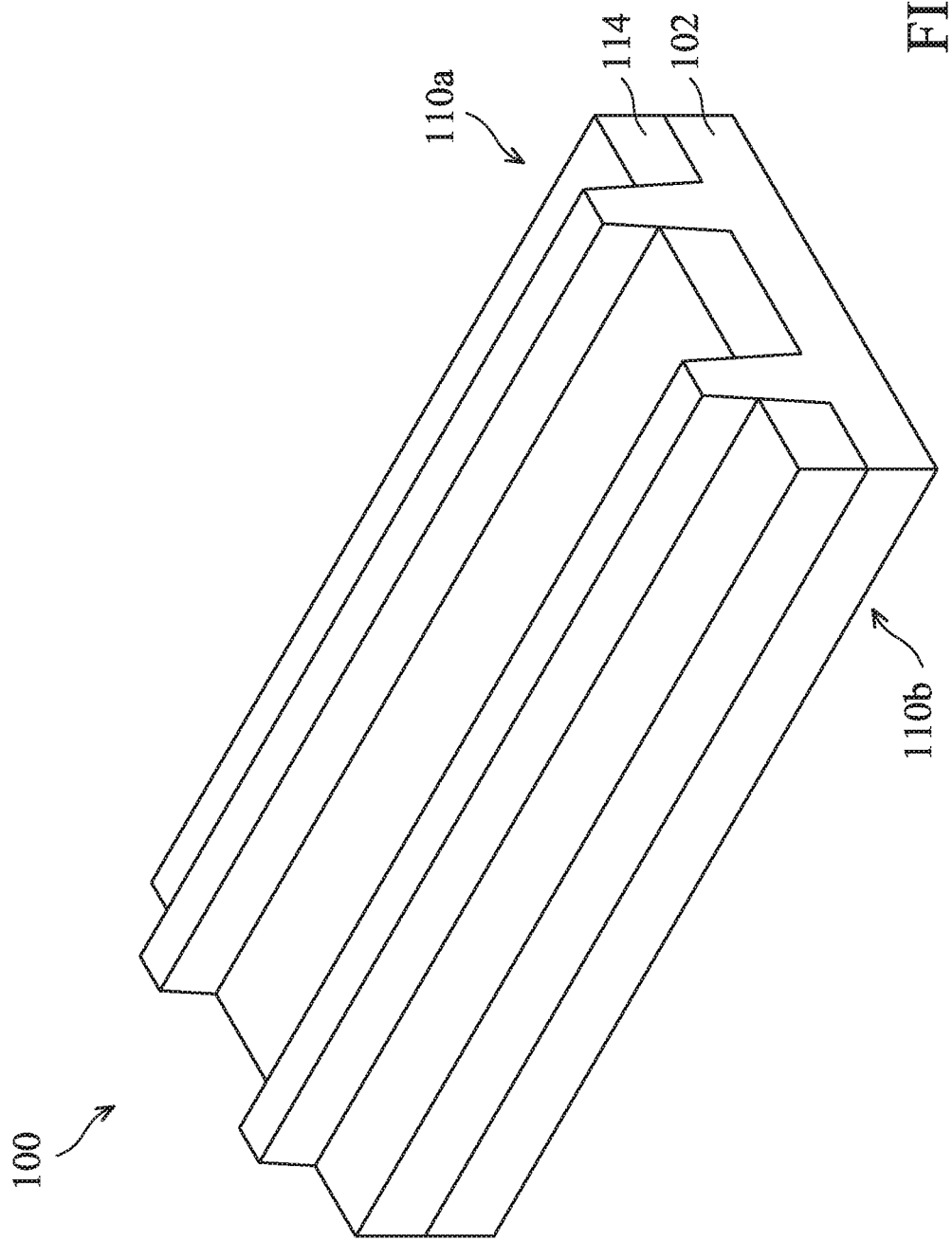
FIGS. 1A-1B show perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches that are smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Figure 1B:
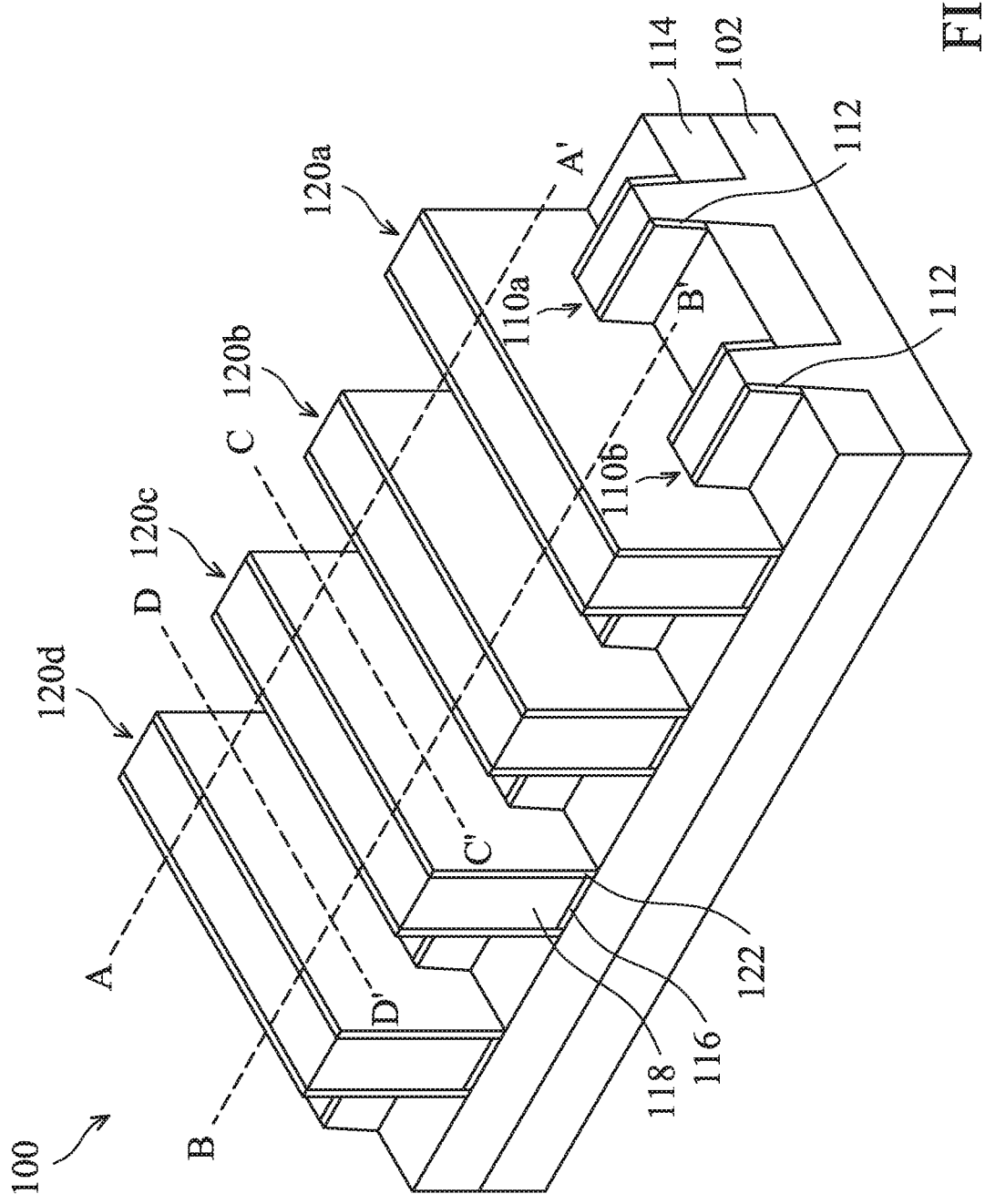

Embodiments for forming a fin field effect transistor (FinFET) device structure are provided. FIGS. 1A-1B show perspective representations of various stages of forming a FinFET device structure 100, in accordance with some embodiments of the disclosure. In some embodiments, the FinFET device structure 100 is a part of a logic device or a memory device.

Referring to FIG. 1A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Afterwards, a dielectric layer (not shown) and a mask layer (not shown) are formed over the substrate 102, and a photoresist layer (not shown) is formed over the mask layer. The photoresist layer is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

After the photoresist layer is patterned, the dielectric layer and the mask layer are patterned by using the patterned photoresist layer as a mask. As a result, a patterned pad layer and a patterned mask layer are obtained. Afterwards, the patterned photoresist layer is removed.

Afterwards, an etching process is performed on the substrate 102 to form a first fin structure 110a and a second fin structure 110b by using the patterned dielectric layer and the patterned mask layer as a mask. The etching process may be a dry etching process or a wet etching process.

In some embodiments, the substrate 102 is etched using a dry etching process. The dry etching process includes using a fluorine-based etchant gas, such as $SF_6$, $C_xF_y$, $NF_3$ or a combination thereof. The etching process may be a time-controlled process, and continue until each of the first fin structure 110a and the second fin structure 110b reaches the predetermined height. In some other embodiments, the first fin structure 110a and the second fin structure 110b both have a width that gradually increases from the top portion to the lower portion.

Next, as shown in FIG. 1A, after the first fin structure 110a and the second fin structure 110b are formed, an insulating layer is formed to cover the first fin structure 110a and the second fin structure 110b over the substrate 102, in accordance with some embodiments.

In some embodiments, the insulating layer is made of silicon oxide, silicon nitride, silicon oxynitride, fluoride-doped silicate glass (FSG), or another low-k dielectric material. The insulating layer may be deposited by a chemical vapor deposition (CVD) process, a spin-on-glass process, or another applicable process.

Afterwards, the insulating layer is thinned or planarized to expose the top surface of the patterned mask layer. In some embodiments, the insulating layer is thinned by a chemical mechanical polishing (CMP) process. Next, the patterned dielectric layer and the patterned mask layer are removed.

Afterwards, a portion of the insulating layer is removed to form an isolation structure 114, in accordance with some embodiments. The isolation structure 114 may be a shallow trench isolation (STI) structure surrounding the first fin structure 110a and the second fin structure 110b. A lower portion of each of the first fin structure 110a and the second fin structure 110b is surrounded by the isolation structure 114, and an upper portion of each of the first fin structure 110a and the second fin structure 110b protrudes from the isolation structure 114. In other words, a portion of the first fin structure 110 and a portion of the second fin structure 110b are embedded in the isolation structure 114. The isolation structure 114 prevents electrical interference and crosstalk.

Afterwards, as shown in FIG. 1B, a first dummy gate structure 120a, a second dummy gate structure 120b, a third dummy gate structure 120c and a fourth dummy gate structure 120d are formed across the first fin structure 110a and the second fin structure 110b and extend over the isolation structure 114, in accordance with some embodiments. In some embodiments, each of the first dummy gate structure 120a, the second dummy gate structure 120b, the third dummy gate structure 120c and the fourth dummy gate structure 120d includes a dummy gate dielectric layer 116 and a dummy gate electrode layer 118 formed over the dummy gate dielectric layer 116.

After the first dummy gate structure 120a, the second dummy gate structure 120b, the third dummy gate structure 120c and the fourth dummy gate structure 120d are formed, the gate spacers 122 are formed on opposite sidewall surfaces of the dummy gate structures 120a, 120b, 120c and 120d. The gate spacers 122 may be a single layer or multiple layers. In addition, fin spacers 112 are formed on opposite sidewall surfaces of the first fin structure 110a and the second fin structure 110b. The height of the fin spacer 112 at this stage is substantially equal to the fin height of each of the first fin structure 110a and the second fin structure 110b.

The gate spacers 112 and the fin spacers 112 are independently made of silicon nitride, silicon oxide, silicon oxynitride, silicon carbide or another applicable material. In order to improve the speed of the FinFET device structure, the gate spacer layers 122 and the fin spacers 112 are made of low-k dielectric materials. In some embodiments, the low-k dielectric materials has a dielectric constant (k value) is less than 4. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

In some other embodiments, the gate spacer layers 122 and the fin spacers 112 are made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the gate spacers 112 and the fin spacers 112 are made of the same material. In some embodiments, the gate spacers 112 and the fin spacers 112 are formed by depositing a spacer layer and etching the space layer.

Figure 2A:
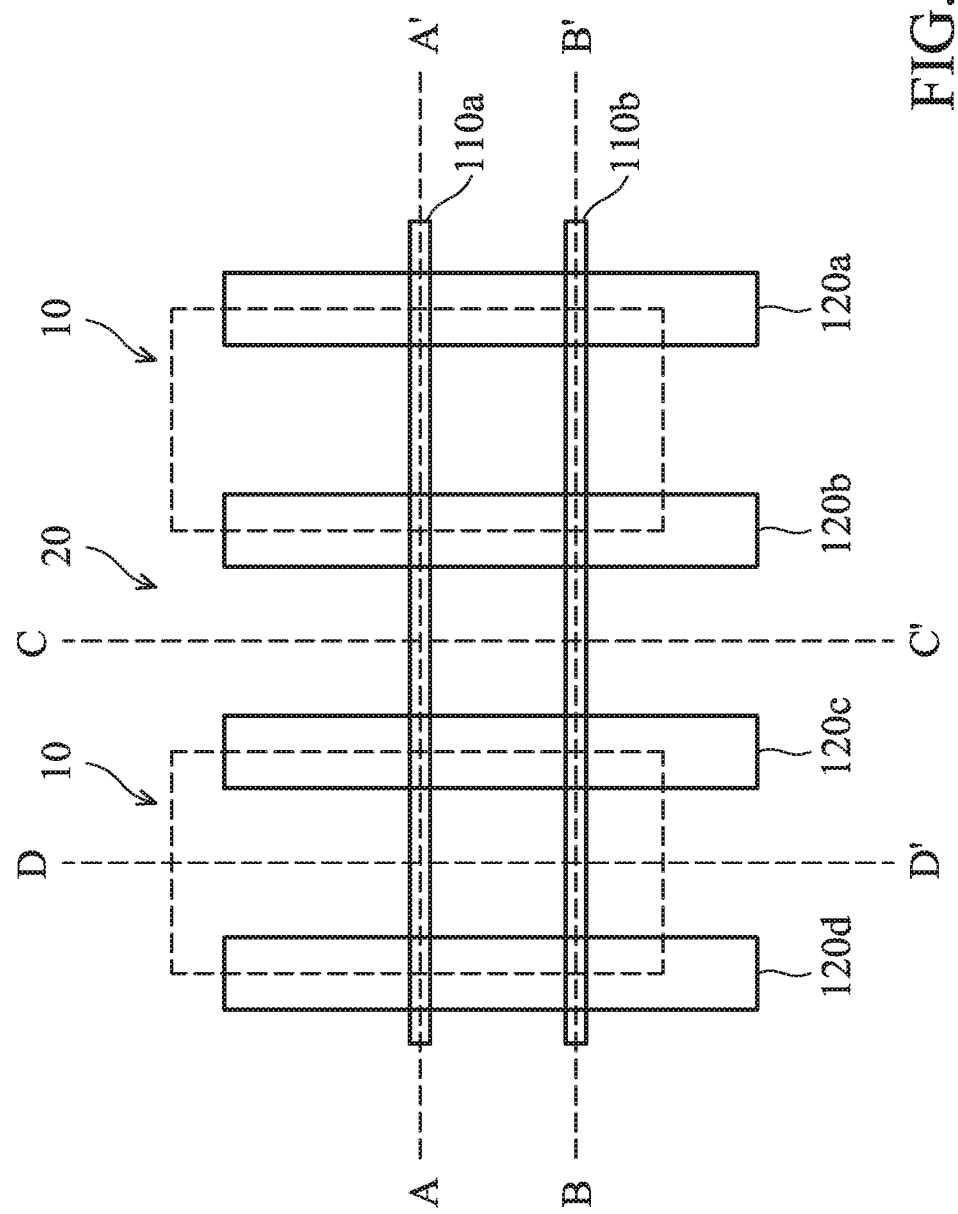
FIG. 2A shows a top-view of FinFET device structure, in accordance with some embodiments of the disclosure.

FIG. 2A shows a top-view of FinFET device structure 100, in accordance with some embodiments of the disclosure.

The substrate 102 includes a first region 10 and a second region 20. In some embodiments, the first region 10 is a pickup region, and the second region 20 is a non-pickup region. The pickup region 10 is used to apply a predetermined bias voltage to some device in the FinFET device structure 100. It should be noted that the first region 10 and the second region 20 both belong to a single device. The single device may be a logic device (such as inventor, NAND or NOR) or a memory device (such as static random access memory (SRAM)). In some embodiments, the first region 10 and the second region 20 are a part of the static random access memory (SRAM).

As shown in FIG. 2A, the first dummy gate structure 120a, the second dummy gate structure 120b, the third dummy gate structure 120c and the fourth dummy gate structure 120d are across on the first fin structure 110a and the second fin structure 110b. The first dummy gate structure 120a, the second dummy gate structure 120b, the third dummy gate structure 120c and the fourth dummy gate structure 120d are arranged in parallel to each other.

Figure 2B:
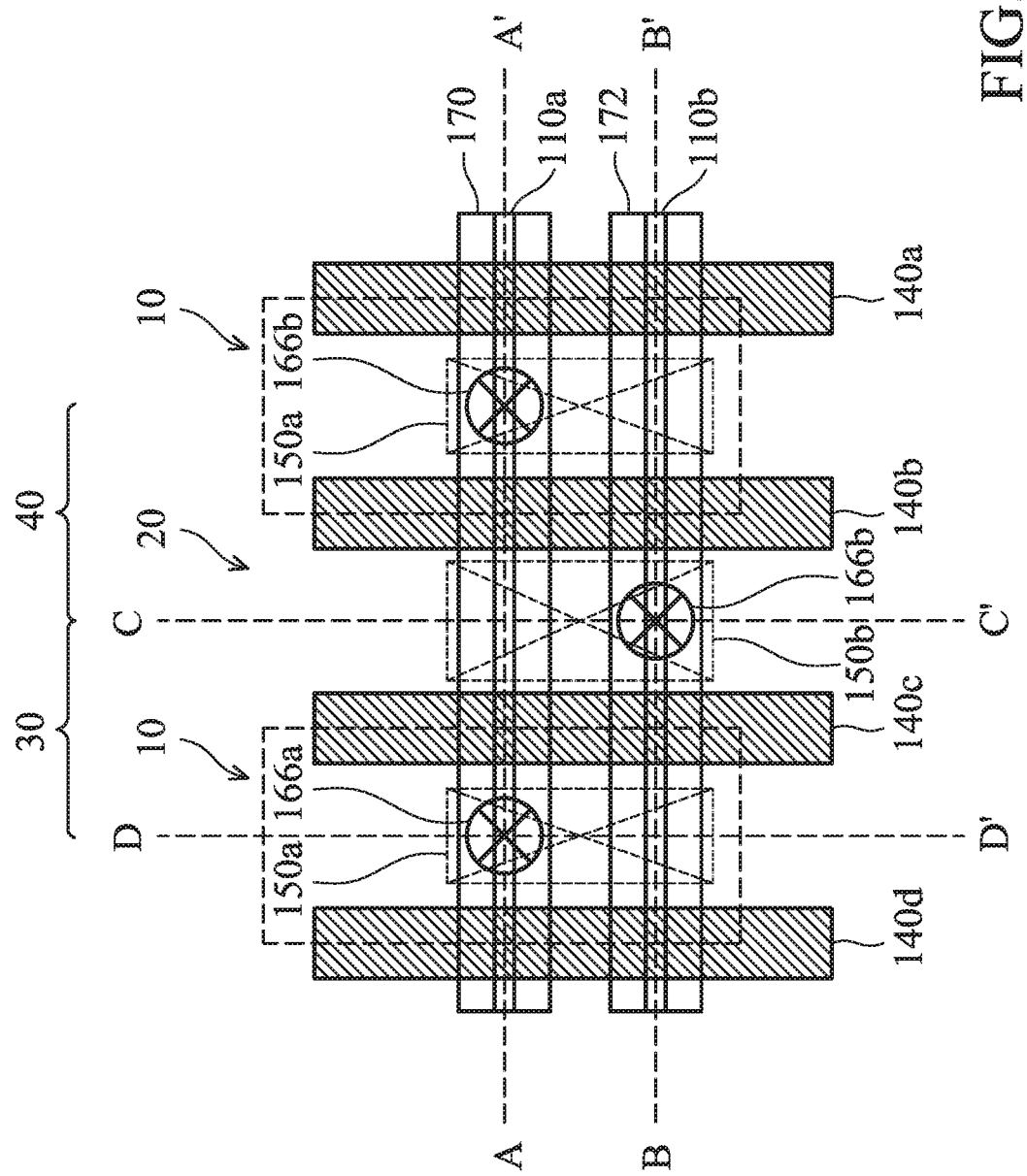
FIG. 2B shows a top-view of the FinFET device structure, in accordance with some embodiments of the disclosure.
Figure 2C:
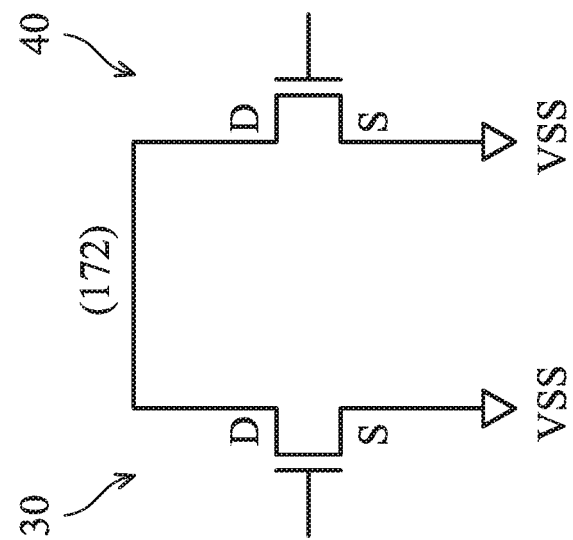
FIGS. 2C and 2D show equivalent circuits of the FinFET device structure, in accordance with some embodiments of the disclosure.

FIG. 2B shows a top-view of the FinFET device structure 100, in accordance with some embodiments of the disclosure. FIG. 2C shows an equivalent circuit of the FinFET device structure 100, in accordance with some embodiments of the disclosure. FIGS. 3A-3G show cross-sectional representations of various stages of forming the FinFET device structure 100 after the structure of FIG. 1B, in accordance with some embodiments of the disclosure. FIGS. 3A-3G show cross-sectional representations taken along line A-A' of the FinFET device structure 100 in FIG. 2A and FIG. 2B.

Figure 3A:
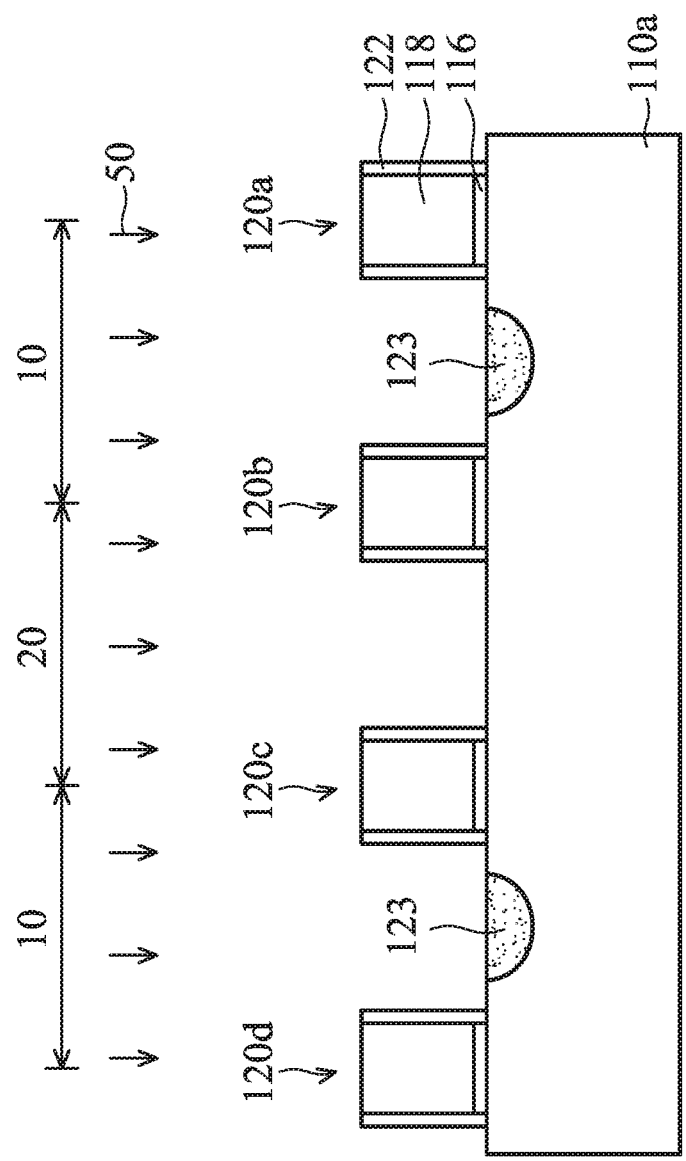
FIGS. 3A-3G show cross-sectional representations of various stages of forming the FinFET device structure after the structure of FIG. 1B, in accordance with some embodiments of the disclosure.

As shown in FIG. 3A, the first dummy gate structure 120a, the second dummy gate structure 120b, the third dummy gate structure 120c and the fourth dummy gate structure 120d are formed over the first fin structure 110a, in accordance with some embodiments of the disclosure.

Next, a doping process 50 is performed on a portion of the first fin structure 110a. The doping process 50 is formed on the first region 10, but not performed on the second region 20. The portion of the first fin structure 110a is doped with a dopant to form a doped region 123. The doping process 50 is used to change the crystal lattice of the first fin structure 110a, and therefore the doped region 123 of the first fin structure 110a will be removed easily by the following process.

In some embodiments, the doping process includes doping with the dopant, the dopant is a nitrogen-containing compound. In some embodiments, the nitrogen-containing compound is nitrogen ($N_2$), ammonia, hydrazine ($N_2H_4$) or another applicable material.

In some other embodiments, the doping process 50 is simultaneously formed on the first region 10 and the second region 20, but the doping concentration of the first fin structure 110a in the first region 10 is different from the doping concentration of the first fin structure 110a in the second region 20. For example, the doping concentration of the first fin structure 110a in the first region 10 is higher than that of the first fin structure 110a in the second region 20. In addition, the dopant in the first region 10 can be implanted into a relative deep region than the dopant in the second region 20 in the first fin structure 110a.

Figure 3B:
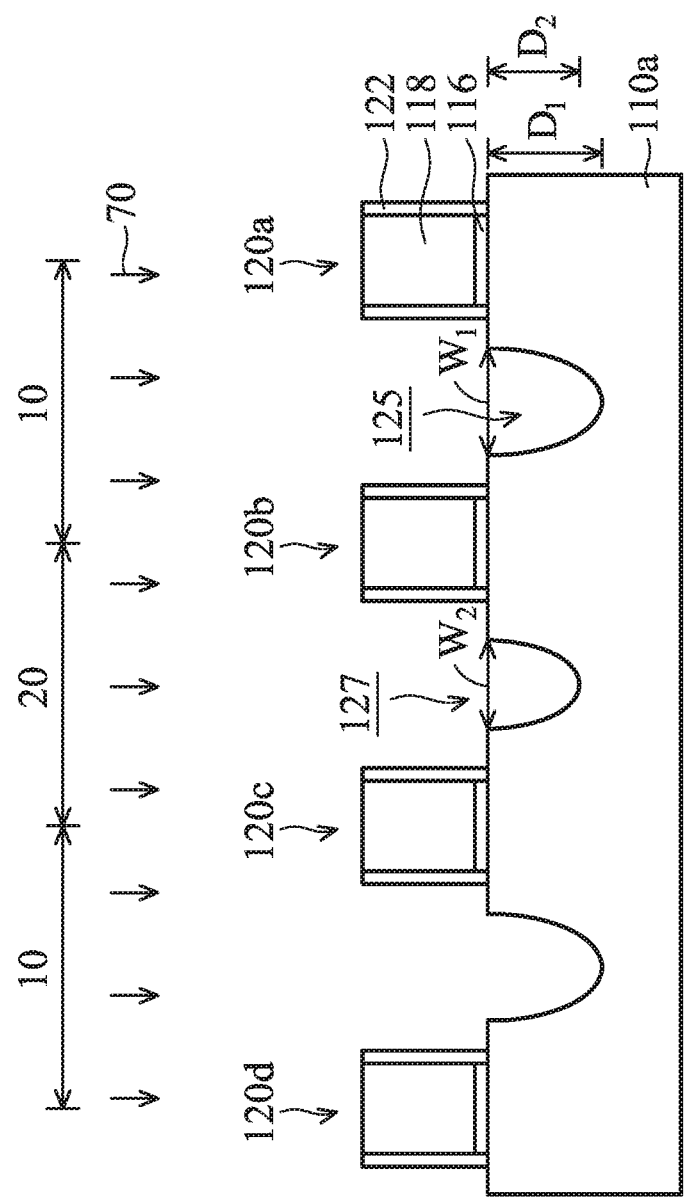

Subsequently, as shown in FIG. 3B, a portion of the first fin structure 110a is removed, in accordance with some embodiments of the disclosure. The portion of the first fin structure 110a is removed by an etching process 70. Therefore, a first recess 125 is formed in the first region 10, and a second recess 127 is formed in the second region 20.

Since the first doping region 123 is pre-formed before the etching process 70, the etching rate of the first doping region 123 of the first fin structure 110a is faster than the un-doped region of the first fin structure 110a. Therefore, the first recess 125 is deeper and wider than the second recess 127. The first recess 125 has a first depth $D_1$ measured from a top surface of the first fin structure 110a to a bottom surface of the first recess 125. The second recess 127 has a second depth $D_2$ measured from a top surface of the first fin structure 110a to a bottom surface of the second recess 127.

In some embodiments, the first depth $D_1$ is greater than the second depth $D_2$. The first recess 125 has a first width $W_1$ in a horizontal direction, and the second recess 127 has a second width $W_2$ in a horizontal direction. In some embodiments, the first width $W_1$ is greater than the second width $W_2$.

Figure 3C:
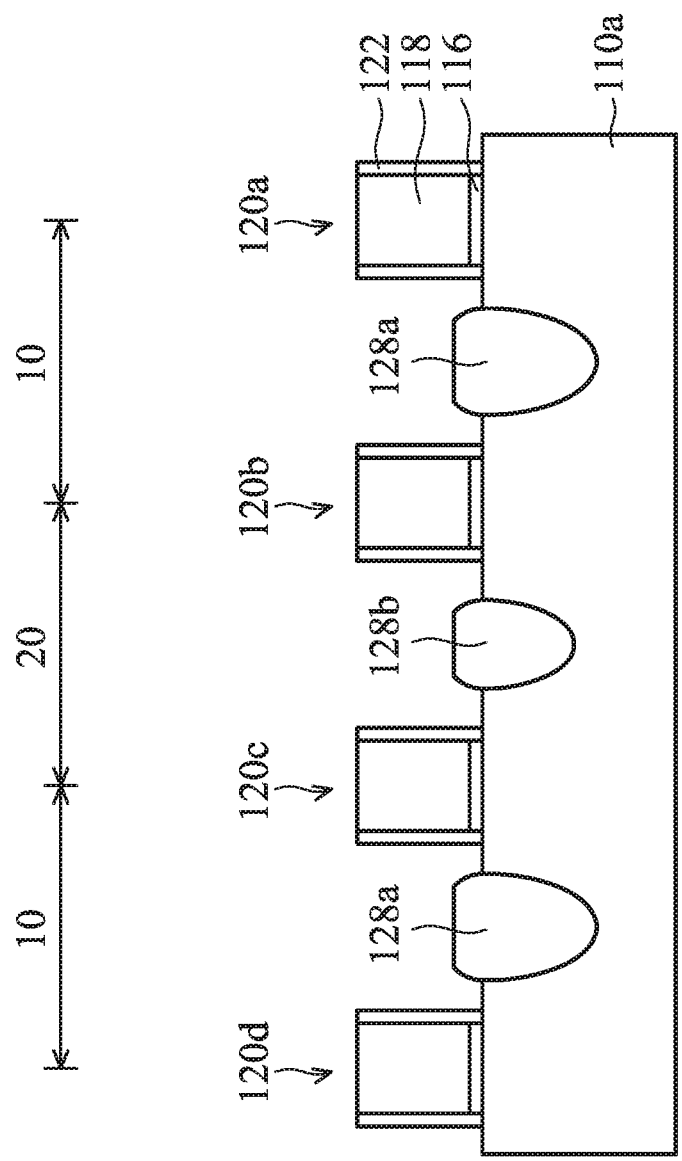

Next, as shown in FIG. 3C, a first source/drain (S/D) structure 128a is formed in the first recess 125 in the first region 10, and a second S/D structure 128b is formed in the second recess 127 in the second region 20, in accordance with some embodiments of the disclosure.

It should be noted that, since the first recess 125 is deeper and wider than the second recess 127, the size of first S/D structure 128a is greater than the size of the second S/D structure 128b. More specifically, the first volume of the first S/D structure 128a is greater than the second volume of the second S/D structure 128b.

In some embodiments, the first S/D structure 128a and the second S/D structure 128b are formed by epitaxially growing in an epitaxial-growth chamber. In some embodiments, the first S/D structure 128a and the second S/D structure 128b are raised S/D structure. In addition, the lattice constant of the first S/D structure 128a and the second S/D structure 128b are different from the lattice constant of the substrate 102. In some embodiments, the first S/D structure 128a and the second S/D structure 128b include Ge, SiGe, InAs, InGaAs, InSb, GaAs, GaSb, InAlP, InP, or the like.

Figure 3D:
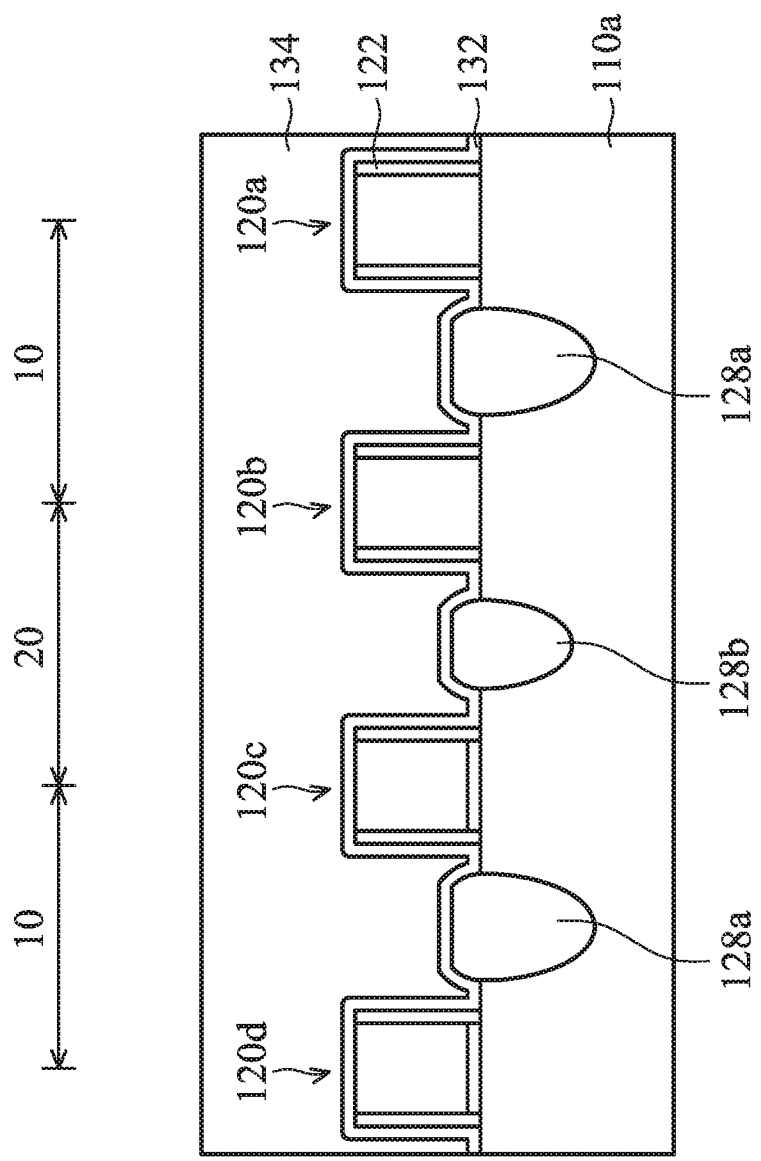

Next, as shown in FIG. 3D, a contact etch stop layer (CESL) 132 is formed over the substrate 102, and an inter-layer dielectric (ILD) layer 134 is formed over the CESL 132, in accordance with some embodiments of the disclosure.

In some other embodiments, the CESL 132 is made of silicon nitride, silicon oxynitride, or another applicable material. The CESL 132 may be formed by plasma enhanced CVD, low-pressure CVD, ALD, or another applicable process.

The ILD layer 134 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, or another applicable dielectric material. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 134 may be formed by chemical vapor deposition (CVD), physical vapor deposition, (PVD), atomic layer deposition (ALD), spin-on coating, or another applicable process.

Figure 3E:
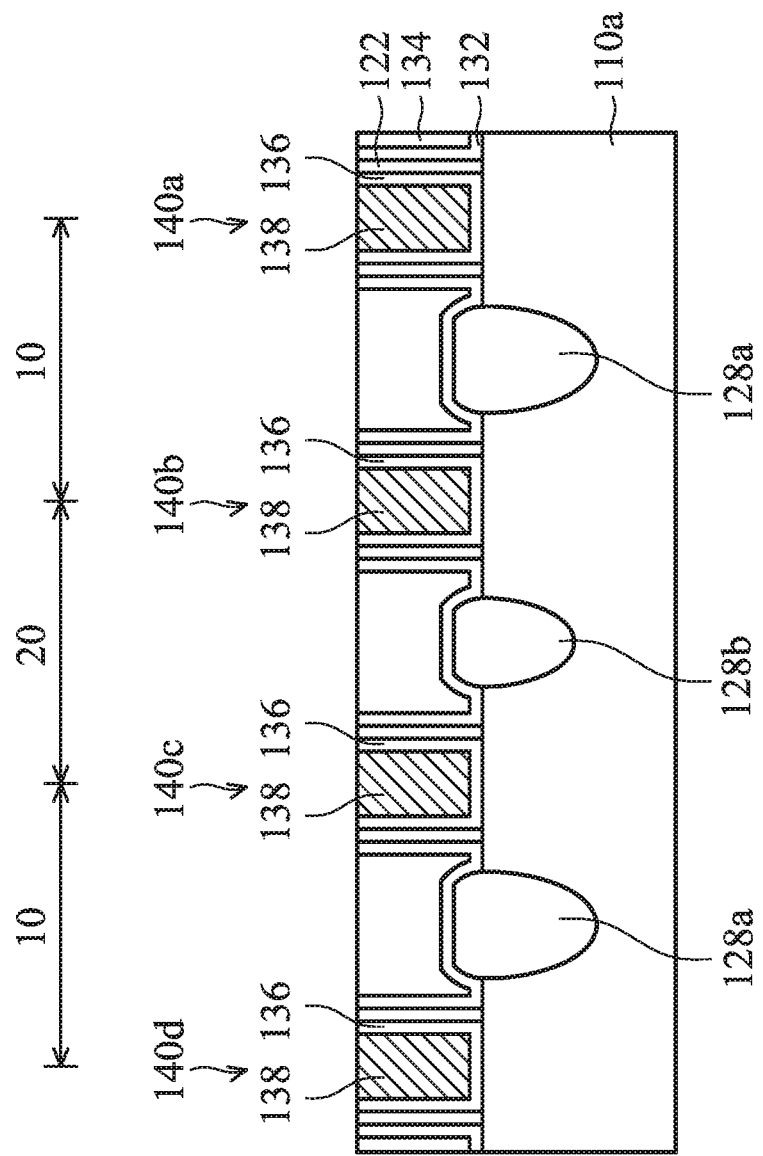

Afterwards, as shown in FIG. 3E, a polishing process is performed on the ILD layer 134 until the top surfaces of the dummy gate structures 120a, 120b, 120c and 120d are exposed, in accordance with some embodiments. In some embodiments, the ILD layer 134 is planarized by a chemical mechanical polishing (CMP) process.

Next, the dummy gate structures 120a, 120b, 120c and 120d are removed to form a number of trenches (not shown) in the ILD layer 134 The dummy gate dielectric layer 116 and the dummy gate electrode layer 118 are removed by an etching process, such as a dry etching process or a wet etching process.

Next, a first gate structure 140, a second gate structure 140b, a third gate structure 140c and a fourth gate structure 140d are formed in the trenches. Each of the first gate structure 140a, the second gate structure 140b, the third gate structure 140c and the fourth gate structure 140d includes a gate dielectric layer 136 and a gate electrode layer 138.

The gate dielectric layer 136 may be a single layer or multiple layers. The gate dielectric layer 136 is made of silicon oxide (SiOx), silicon nitride (SixNy), silicon oxynitride (SiON), dielectric material(s) with high dielectric constant (high-k), or a combination thereof. In some embodiments, the gate dielectric layer 136 is deposited by a plasma enhanced chemical vapor deposition (PECVD) process or by a spin coating process. The high dielectric constant (high-k) material may be hafnium oxide (HfO$_2$), zirconium oxide (ZrO$_2$), lanthanum oxide (La$_2$O$_3$), yttrium oxide (Y$_2$O$_3$), aluminum oxide (Al$_2$O$_3$), titanium oxide (TiO$_2$) or another applicable material.

The gate electrode layer 138 is made of conductive material, such as aluminum (Al), copper (Cu), tungsten (W), titanium (Ti), tantalum (Ta), or another applicable material. The gate electrode layer 138 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

In some embodiments, each of the first gate structure 140a, the second gate structure 140b, the third gate structure 140c and the fourth gate structure 140d further includes a work function layer. The work function layer is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

Figure 3F:
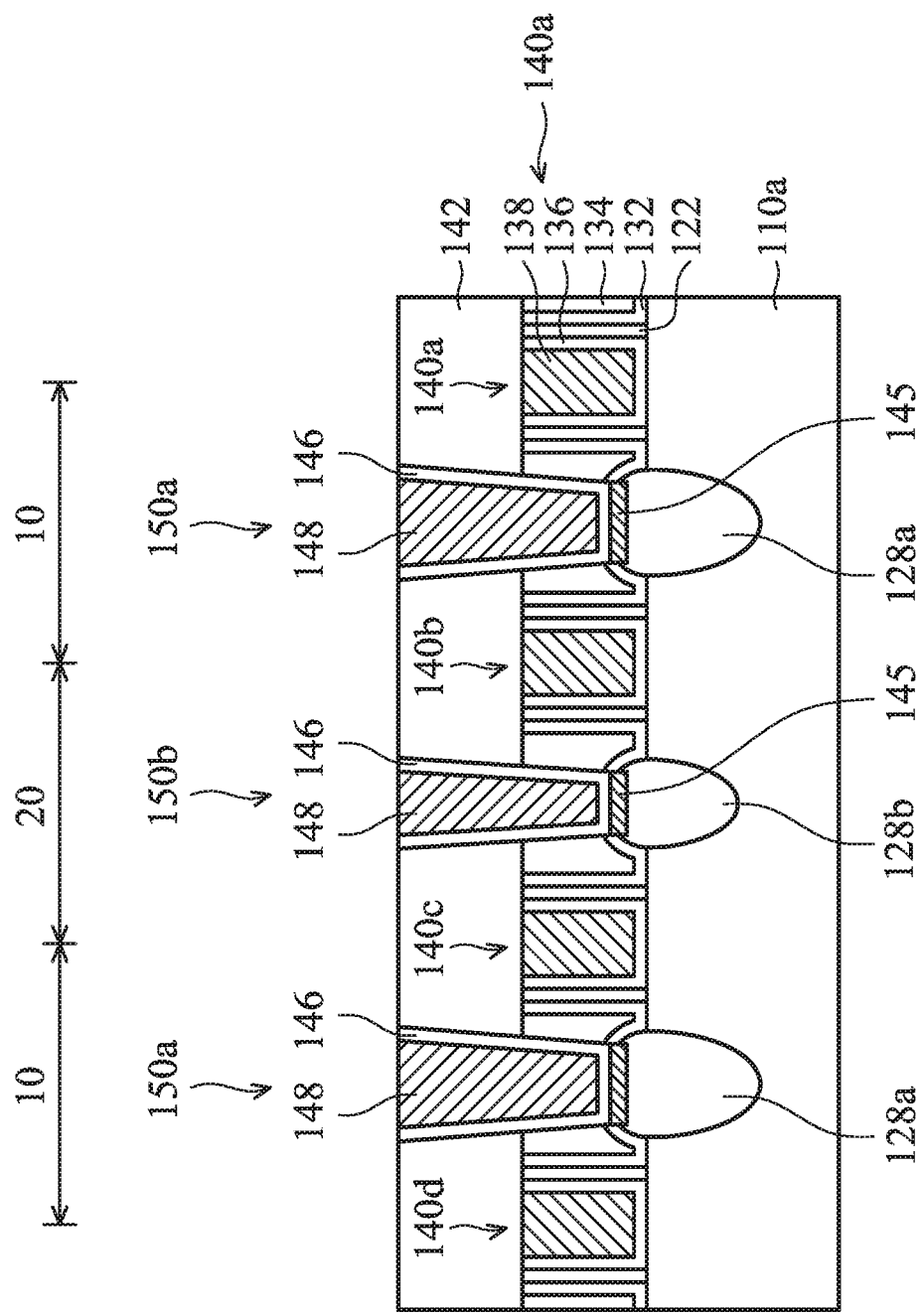

Next, as shown in FIG. 3F, a first dielectric layer 142 is formed over the first gate structure 140a, the second gate structure 140b, the third gate structure 140c and the fourth gate structure 140d, in accordance with some embodiments.

The first dielectric layer 142 may be a single layer or multiple layers. The first dielectric layer 142 is made of silicon oxide (SiOx), silicon nitride (SixNy), silicon oxynitride (SiON), dielectric material(s) with a low dielectric constant (low-k), or a combination thereof. In some embodiments, the first dielectric layer 142 is made of an extreme low-k (ELK) dielectric material with a dielectric constant (k) less than about 2.5. In some embodiments, the dielectric layer 142 is deposited by a plasma enhanced chemical vapor deposition (PECVD) process or by a spin coating process.

Afterwards, a portion of CESL 132, a portion of the ILD layer 134 and a portion of the first dielectric layer 142 are removed to form a trench. As a result, the first S/D structure 128a and the second S/D structure 128b are exposed by the trench. Next, a metal silicide layer 145 is formed on the first S/D structure 128a and the second S/D structure 128b, and a first S/D contact structure 150a and a second S/D contact structure 150b are formed on the metal silicide layer 145. The metal silicide layer 145 is used to reduce the contact resistance between the first S/D contact structure 150a and the first S/D structure 128a.

Each of the first S/D contact structure 150a and the second S/D contact structure 150b includes a barrier layer 146 and a conductive layer 148. The first S/D contact structure 150a is electrically connected to the first S/D contact structure 128a, and the second contact structure 150b is electrically connected to the second S/D contact structure 128b.

In some embodiments, a metal layer is formed over the first S/D structure 128a and the second S/D structure 128b, and an annealing process is performed on the metal layer to form the metal silicide layer 145. The metal layer may be made of nickel (Ni), titanium (Ti), cobalt (Co), tantalum (Ta) or platinum (Pt) or another applicable material. The metal layer may be formed by a deposition process, such as chemical vapor deposition (CVD) process, physical vapor deposition (PVD) process, atomic layer deposition (ALD) process, or another applicable process. In some other embodiments, the metal silicide layer 145 is made of titanium silicide (TiSix). In some other embodiments, the metal silicide layer 145 is made of or tantalum silicide (TaSix).

Figure 3G:
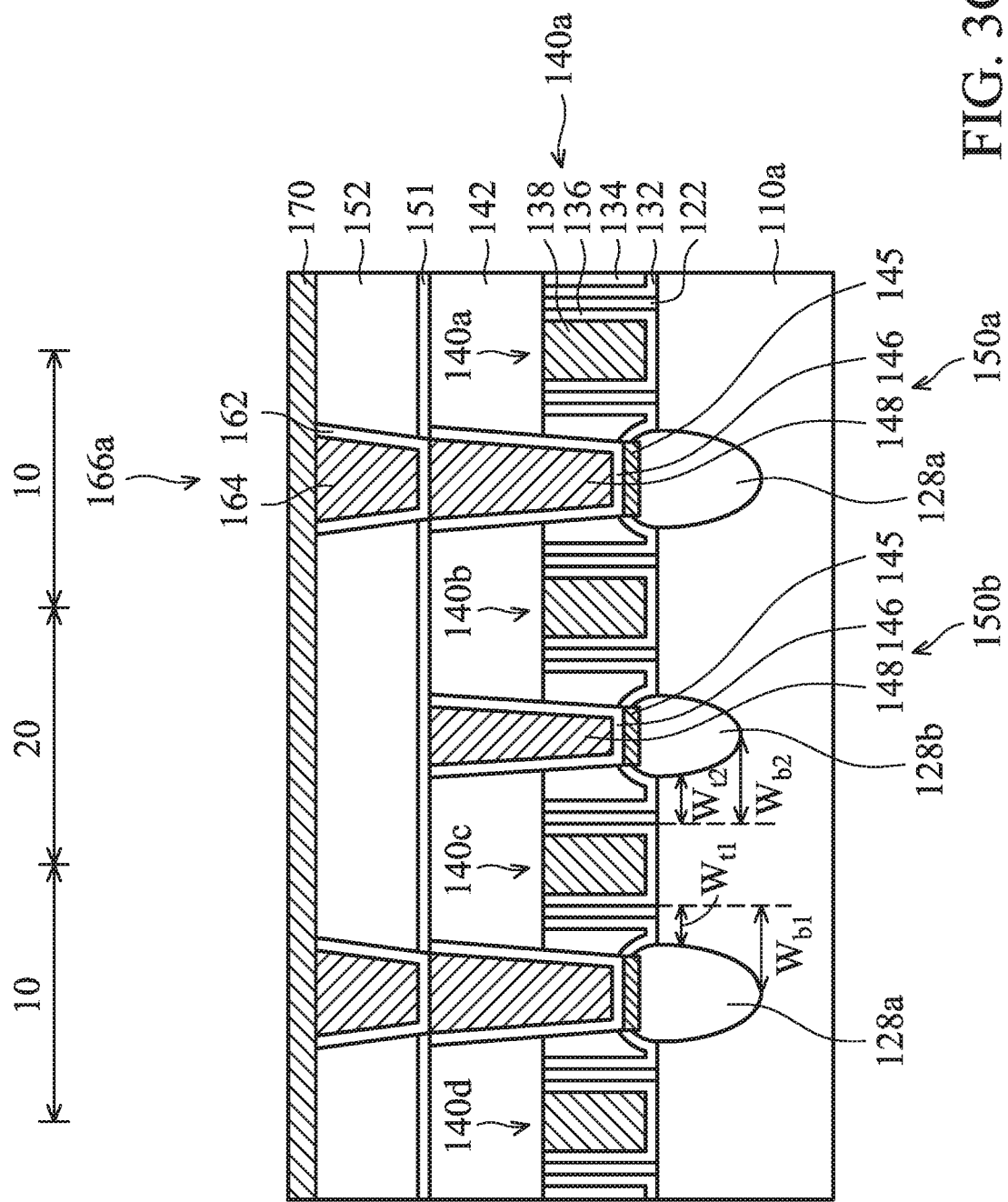

Afterwards, as shown in FIG. 3G, a first etching stop layer 151 is formed over the first dielectric layer 142, the first S/D contact structure 150a and the second S/D contact structure 150b, in accordance with some embodiments. Next, a second dielectric layer 152 is formed over the first etching stop layer 151.

The first etching stop layer 151 is made of silicon oxide (SiOx), silicon carbide (SiC), silicon nitride (SixNy), silicon carbonitride (SiCN), silicon oxycarbide (SiOC), silicon oxycarbon nitride (SiOCN), or another applicable material. In some embodiments, the second dielectric layer 152 is made of silicon oxide (SiOx), silicon nitride (SixNy), silicon oxynitride (SiON), dielectric material(s) with a low dielectric constant (low-k), or a combination thereof. In some embodiments, the first etching stop layer 151 and the second dielectric layer 152 are independently formed in a deposition process, such as an atomic layer deposition (ALD) process, a chemical vapor deposition (CVD) process, a physical vapor deposition (PVD) process, or another applicable process.

A first S/D conductive via 166a is formed in the second dielectric layer 152 and the first etching stop layer 151. The first S/D conductive via 166a includes a barrier layer 162 and a conductive layer 164. In some embodiments, the barrier layer 162 is made of tantalum (Ta), tantalum nitride (TaN), titanium (Ti), titanium nitride (TiN), cobalt tungsten (CoW) or another applicable material. In some embodiments, the conductive layer 164 is made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another application material. In some embodiments, the barrier layer 162 and the conductive layer 164 are independently formed by a deposition process, such as a chemical vapor deposition (CVD) process, physical vapor deposition (PVD) process, atomic layer deposition (ALD) process, plating process or another application process.

In some embodiments, when the first region 10 is a pickup region, a high voltage (or high current) may flow through the devices in the first region 10. In order to conduct the high current, the resistance of the S/D structure should be reduced. It should be noted that the first volume of the first S/D structure 128a in the pickup region 10 is greater than the second volume of the second S/D structure 128b in the non-pickup region 20. By forming the first S/D structure 128a with a large volume to reduce the contact resistance between the first S/D structure 128a and the first S/D contact structure 150a.

Figure 2D:
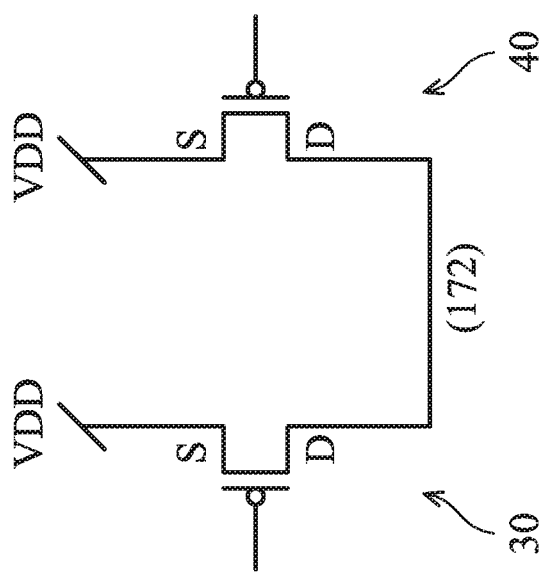

FIG. 2B shows a top-view of the FinFET device structure 100, in accordance with some embodiments of the disclosure. FIGS. 2C and 2D show equivalent circuits of the FinFET device structure 100, in accordance with some embodiments of the disclosure.

As shown in FIG. 2B, a power line 170 is parallel to a signal line 172. A bias voltage is applied to some devices through the power line 170. The power line 170 is parallel to the first fin structure 110a, and the first fin structure 110a is covered by the power line 170. The signal line 172 is used to transfer the signal to the other devices. The signal line 172 is parallel to the second fin structure 110b, and the second fin structure 110b is covered by the signal line 172. The power line 170 is electrically separated from the signal line 172. The power line 170 is directly formed on the first fin structure 110a, and the signal line 172 is directly formed on the second fin structure 110b.

In some embodiments, as shown in FIG. 2B, a first MOS 30 and a second MOS 40 are formed above the substrate 102. The source of the first MOS 30 is the first S/D structure 128a, and the drain of the first MOS 30 is the second S/D structure 128. The source of the second MOS 40 is the first S/D structure 128a, and the drain of the second MOS 40 is the second S/D structure 128b. The source of the first MOS 30 is electrically connected to the power line 170 through the first conductive via 166a and the first S/D contact structure 150a. The drain of the first MOS 40 is electrically connected to the signal line 172 through the second conductive 166b and the second S/D contact structure 150b.

In some embodiments, as shown in FIG. 2C, the substrate 102 includes an N-well, and the first MOS 30 and the second MOS 40 are formed over the N-well and both are PMOS. The source of the first MOS 30 is connected to VDD through the power line 170. More specifically, the VDD is applied to the source through the power line 170.

In some embodiments, as shown in FIG. 2D, the substrate 102 includes a P-well, and the first MOS 30 and the second MOS 40 are formed over the p-well and both are NMOS. The source of the first MOS 30 is connected to VSS (GND) through the power line 170. The source of the second MOS 40 is connected to VSS (GND) through the power line 170. More specifically, the source is grounded when the VSS is applied to the power line 170.

Afterwards, as shown in FIG. 3G, the power line 170 is formed on the second dielectric layer 152 and the first S/D conductive via 166a. A predetermined bias voltage is applied to the power line 170. In some embodiments, the voltage is VDD or VSS. The power line 170 is electrically connected to the first S/D conductive via 166a and the first S/D contact structure 150a in the first region 10 (such as pickup region). It should be noted that the power line 170 is not electrically connected to the second S/D contact structure 150b in the second region 20 (such as non-pickup region). It should be noted that the first region 10 and the second region 20 both belong to a logic device or a memory device. For example, the first region 10 and the second region 20 are a part of the static random access memory (SRAM).

As shown in FIG. 3G, a first top proximity $W_{t1}$ is defined as the distance between the projected figure of the outer edge of the third gate structure 140c and the outer edge of the first S/D structure 128a along the top surface of the first fin structure 110a. A second top proximity $W_{t2}$ is defined as the distance between the projected figure of the outer edge of the third gate structure 140c and the outer edge of the second S/D structure 128a along the top surface of the first fin structure 110a. The first top proximity $W_{t1}$ may be the same or different from the second top proximity $W_{t2}$. In some embodiments, the first top proximity $W_{t1}$ is smaller than the second top proximity $W_{t2}$.

A first bottom proximity $W_{b1}$ is defined as the distance between the projected figure of outer edge of the third gate structure 140c and the bottom surface of the first S/D structure 128a along a horizontal direction. A second bottom proximity $W_{b2}$ is defined as the distance between the projected figure of outer edge of the third gate structure 140c and the bottom surface of the second S/D structure 128b along a horizontal direction. The first bottom proximity $W_{b1}$ may be the same or different from the second bottom proximity $W_{b2}$. In some embodiments, the first bottom proximity $W_{b1}$ is smaller than the second bottom proximity $W_{b2}$.

Figure 4:
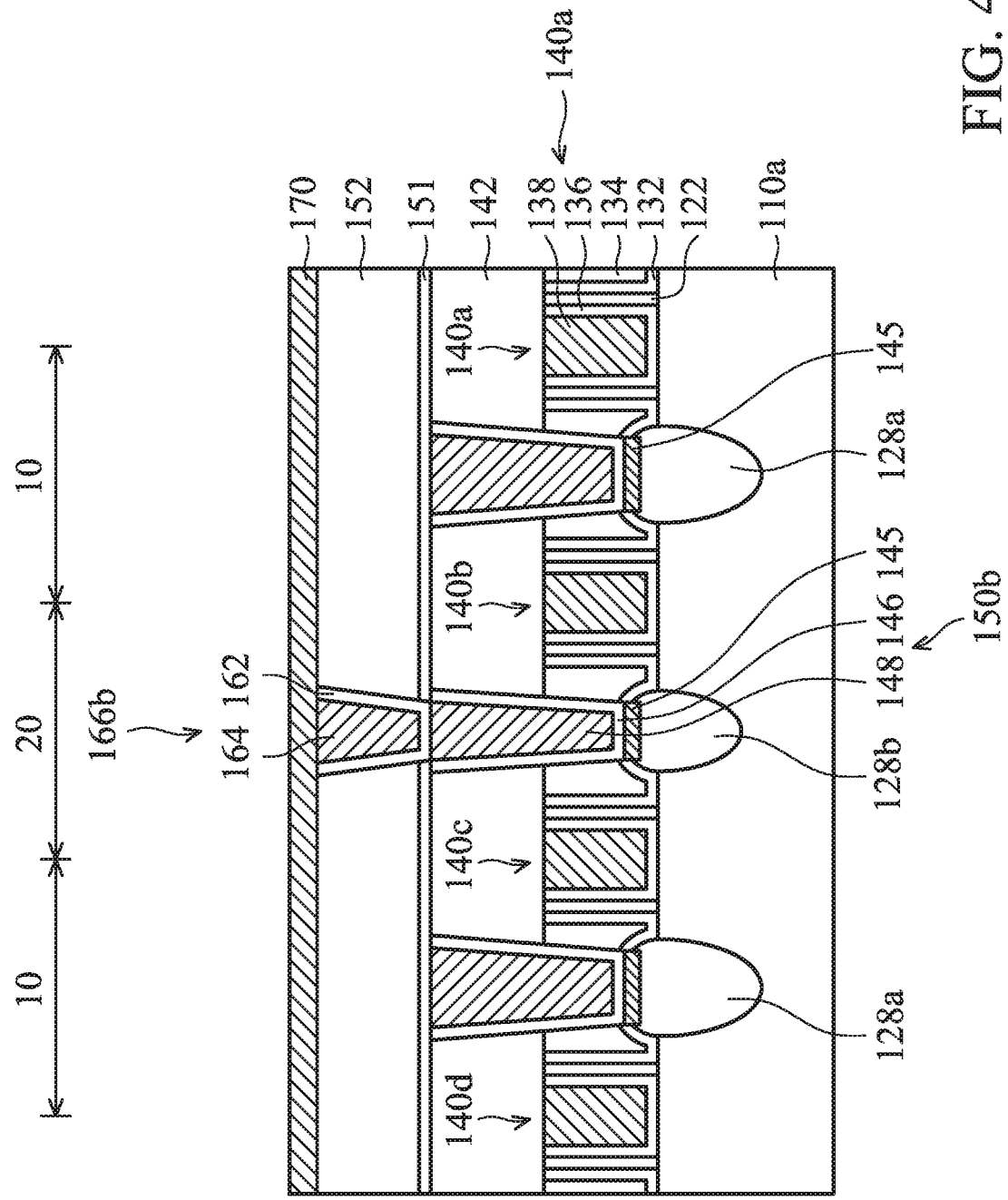
FIG. 4 shows a cross-sectional representation of the FinFET device structure after the structure of FIG. 1B, in accordance with some embodiments of the disclosure.

FIG. 4 shows a cross-sectional representation of the FinFET device structure 100 after the structure of FIG. 1B, in accordance with some embodiments of the disclosure. FIG. 4 shows a cross-sectional representation taken along line B-B' of the FinFET device structure 100 in FIG. 2B.

As shown in FIG. 4 and FIG. 2B, a second S/D conductive via 166b is formed over the second S/D contact structure 150b, in accordance with some embodiments of the disclosure. The second S/D conductive via 166b includes the barrier layer 162 and the conductive layer 164. In the second region 20, the signal line 172 is formed on the second S/D conductive via 166b. The signal line 172 is electrically connected to the second S/D structure 128b through the second S/D conductive via 166b and the S/D contact structure 150b.

FIGS. 5A-5F show cross-sectional representations of various stages of forming the FinFET device structure 100 after the structure of FIG. 1B, in accordance with some embodiments of the disclosure. FIGS. 5A-5F show cross-sectional representations taken along line C-C' of the FinFET device structure 100 in FIG. 2A and FIG. 2B.

Figure 5A:
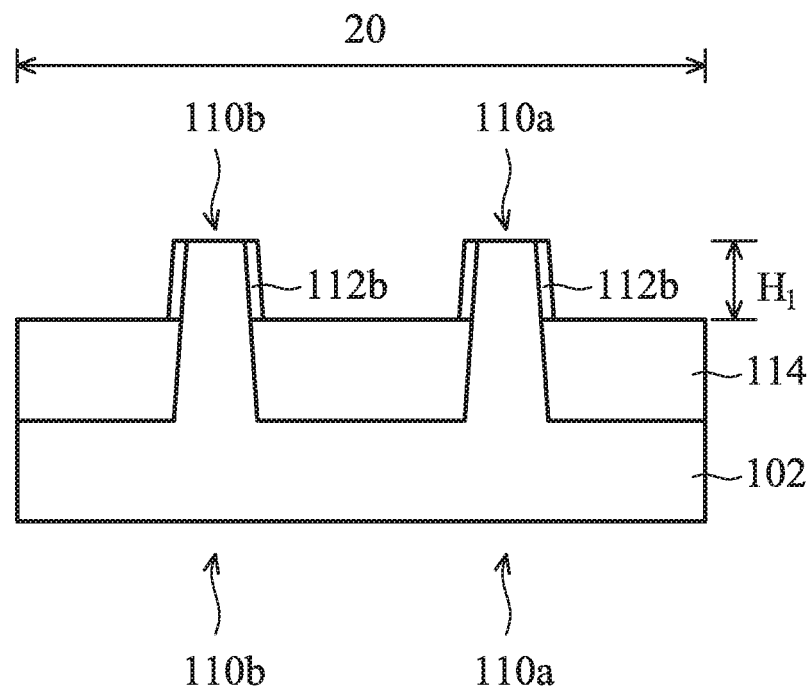
FIGS. 5A-5F show cross-sectional representations of various stages of forming the FinFET device structure after the structure of FIG. 1B, in accordance with some embodiments of the disclosure.

As shown in FIG. 5A, in the second region 20 (such as non-pickup region), the second fin spacers 112b are formed on opposite sides of the first fin structure 110a and the second fin structure 110b. The second fin sidewall spacers 112b are configured to control the volume and the height of the S/D structure. The second fin spacers 112b has a first height $H_1$ which is measured from a top surface of each of the second fin spacers 112b to the top surface of the isolation structure 114.

Figure 5B:
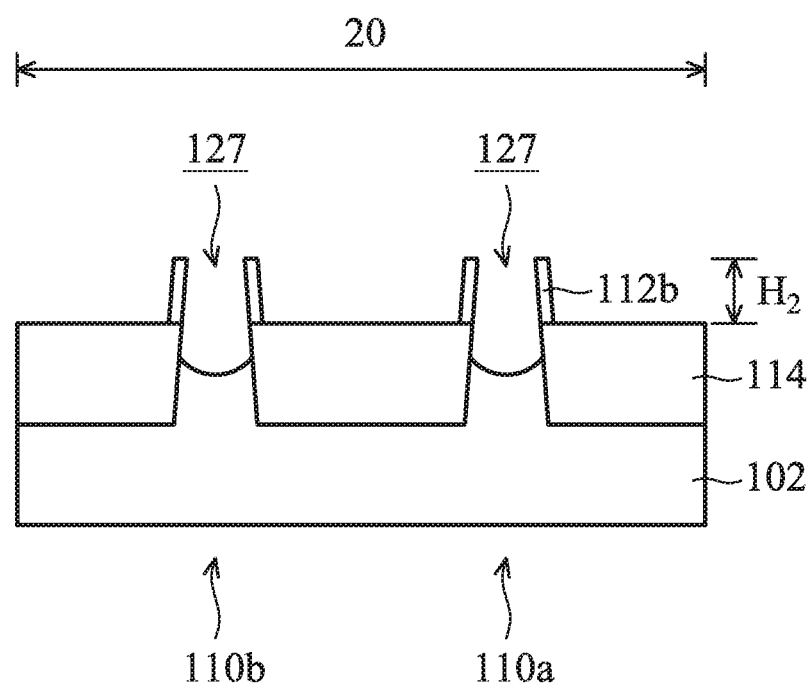

Afterwards, as shown in FIG. 5B, a portion of the first fin structure 110a and a portion of the second fin structure 110b are removed to form a second recess 127, in accordance with some embodiments of the disclosure. In addition, a portion of the second fin spacers 112b is removed. In some embodiments, the portion of the first fin structure 110a and the portion of the second fin spacers 112b may be removed simultaneously. In some other embodiments, the portion of the second fin spacers 112b is first removed, and then the portion of the first fin structure 110a is removed. The portion of the second fin spacers 112b, the portion of the first fin structure 110a and the portion of the second fin structure 110b are removed by an etching process. The etching process may be a single process or multiple processes.

After the etching process, the top surface of the first fin structure 110a and the top surface of the second fin structure 110b are below the top surface of the isolation structure 114. After the etching process, the second fin spacers 112b is reduced to have a second height $H_2$ which is measured from a top surface of each of the second fin spacers 112b to the top surface of the isolation structure 114. The second height $H_2$ is lower than the first height $H_1$.

Figure 5C:
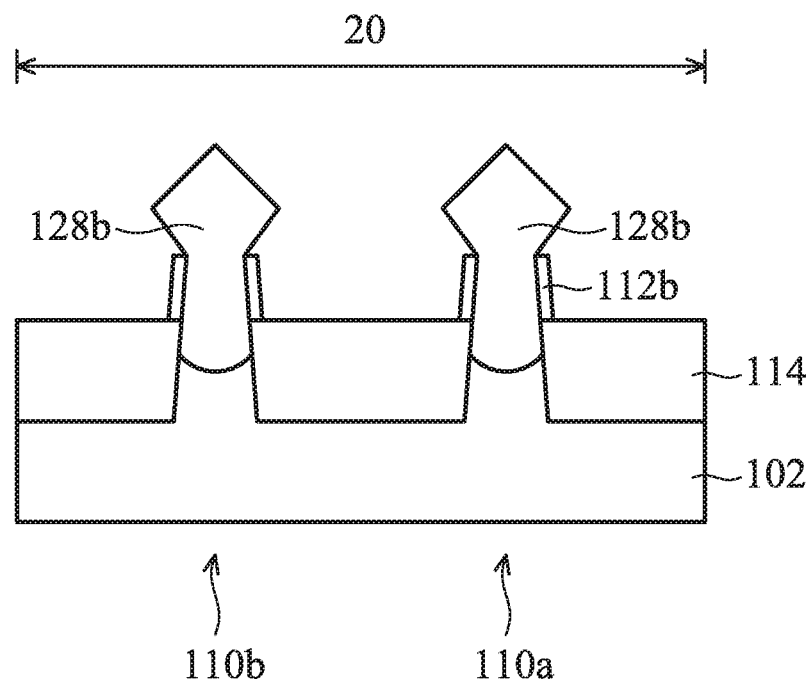
Figure 5C:
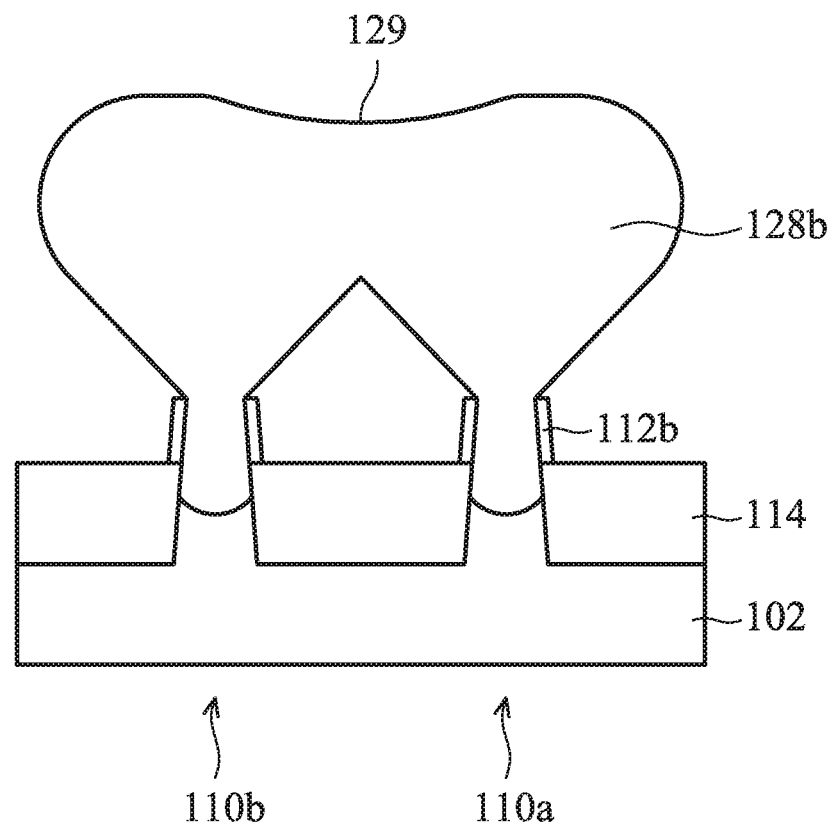

Next, as shown in FIG. 5C, the second S/D structure 128b is formed in the second recess 127, in accordance with some embodiments of the disclosure. In some embodiments, the second S/D structure 128b has a rhombus-like upper portion and a column-like lower portion.

The size or the volume of the second S/D structure 128*b* may be controlled by adjusting the height of the second fin spacer 112*b*. It should be noted that the second fin spacer 112*b* inhibits the growth of the second S/D structure 128*b*, and therefore the second S/D structure 128*b* is prone to growing in the direction of the Y-axis.

FIG. 5C' shows a cross-sectional representation of the second S/D structure 128*b*, in accordance with some embodiments of the disclosure. The second S/D structure 128*b* is a merged S/D structure. The merged S/D structure has a recessed portion 129 at the center of the merged S/D structure. The merged S/D structure provides a large surface area for landing the S/D contact structure due to the recessed portion 129.

Figure 5D:
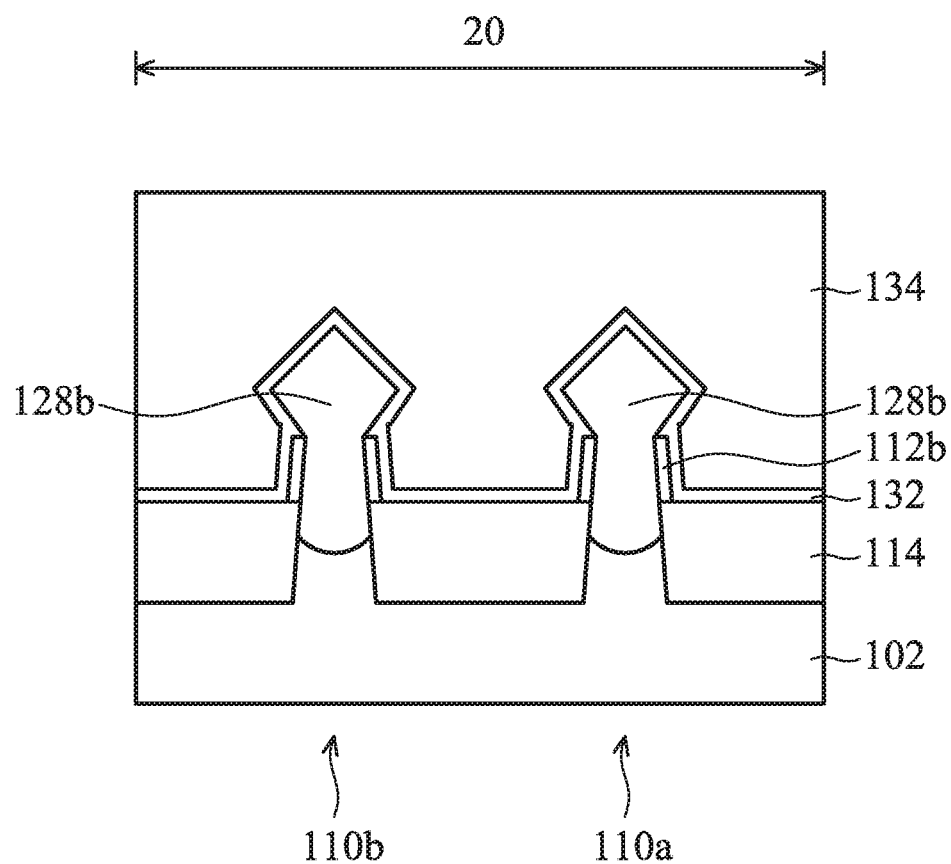

Afterwards, as shown in FIG. 5D, the CESL 132 is formed over the substrate 102, and the ILD layer 134 is formed over the CESL 132, in accordance with some embodiments of the disclosure.

Figure 5E:
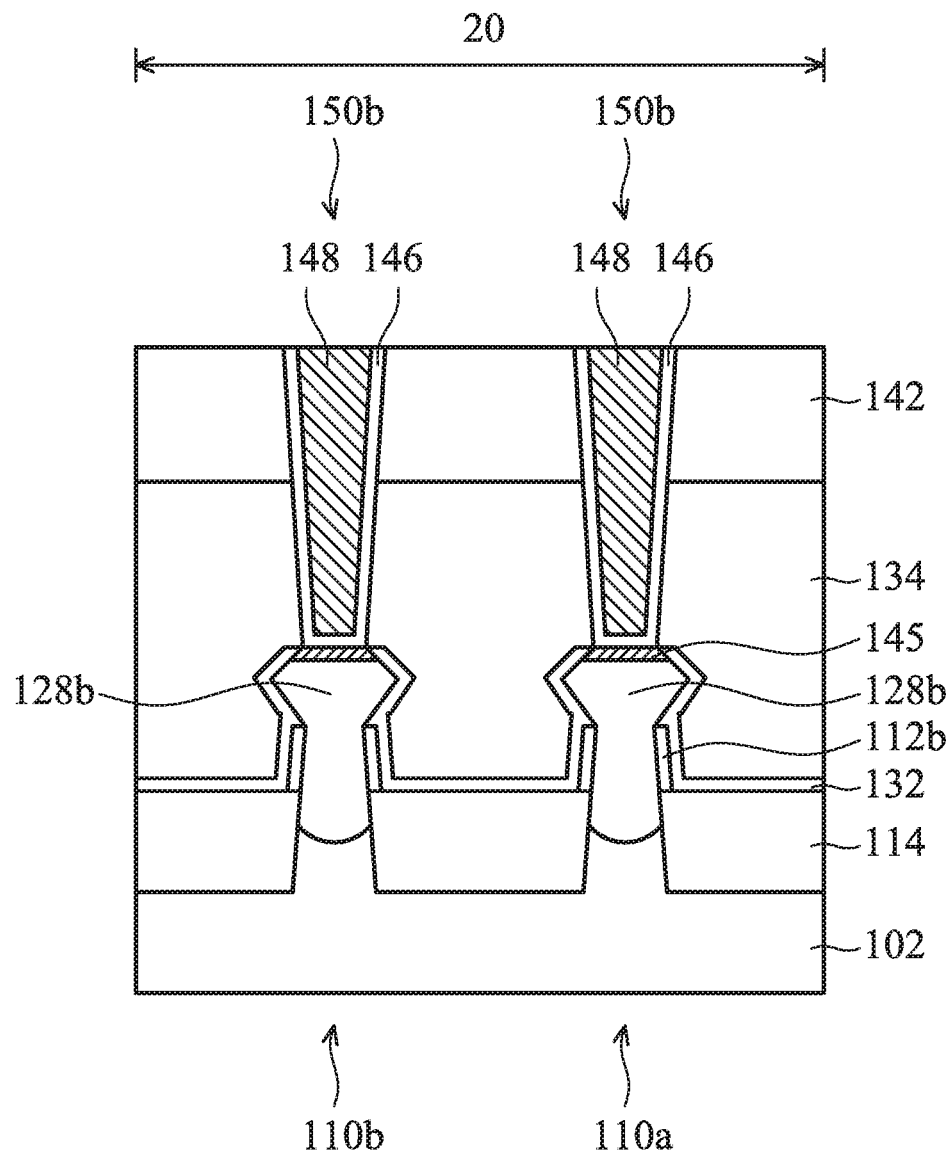

Subsequently, as shown in FIG. 5E, the metal silicide layer 145 is formed on the second S/D structure 128*b*, and the second S/D contact structure 150*b* is formed on the metal silicide layer 145, in accordance with some embodiments of the disclosure. The second S/D contact structure 150*b* includes the barrier layer 146 and the conductive layer 148. The second S/D contact structure 150*b* is electrically connected to the second S/D contact structure 128*b*.

Figure 5F:
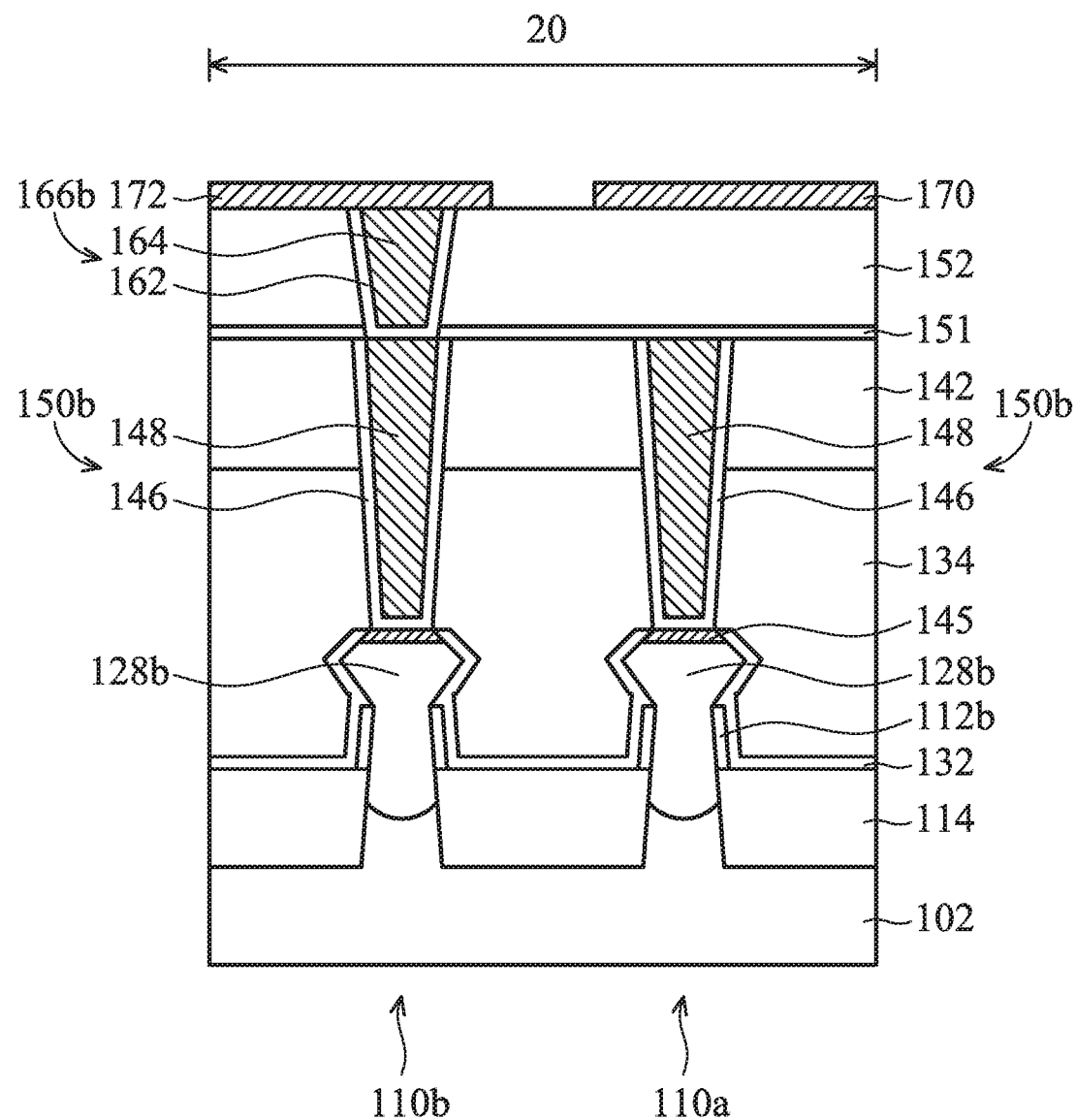

Subsequently, as shown in FIG. 5F, the first etching stop layer 151 is formed over the first dielectric layer 142, and the second S/D contact structure 150*b*, in accordance with some embodiments. Next, the second dielectric layer 152 is formed over the first etching stop layer 151.

The second S/D conductive via 166*b* is formed in the second dielectric layer 152 and the first etching stop layer 151. The second S/D conductive via 166*b* includes the barrier layer 162 and the conductive layer 164. Afterwards, the signal line 172 is formed on the second S/D conductive via 166*b*.

FIGS. 6A-6D show cross-sectional representations of various stages of forming the FinFET device structure 100 after the structure of FIG. 1B, in accordance with some embodiments of the disclosure. FIGS. 6A-6D show cross-sectional representations taken along line D-D' of the FinFET device structure 100 in FIG. 2A and FIG. 2B.

Figure 6A:
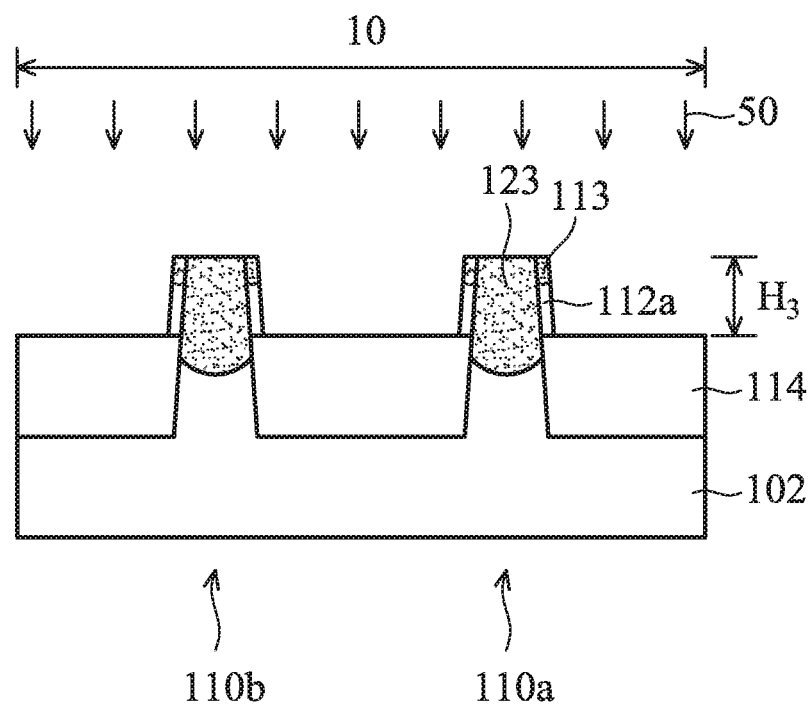
FIGS. 6A-6D show cross-sectional representations of various stages of forming the FinFET device structure after the structure of FIG. 1B, in accordance with some embodiments of the disclosure.

As shown in FIG. 6A, the doping process 50 is performed on a portion of the first fin structure 110*a*. The doping process 50 is formed on the first region 10, but not performed on the second region 20. The top portion of the first fin structure 110*a* is doped with a dopant to form the doped region 123. In addition, a portion of the first fin spacer 112*a* is doped to form the doped region 113. The doped region 123 of the first fin structure 110*a* and the doped region 113 of the first fin spacer 112*a* can be removed easily in the following process compared to the un-doped region.

The first fin spacer 112*a* has a first height $H_3$ which is measured from the top surface of the first fin spacer 112*a* to the top surface of the isolation structure 114. In some embodiments, the first height $H_1$ shown in FIG. 5A is substantially equal to the third height $H_3$.

Figure 6B:
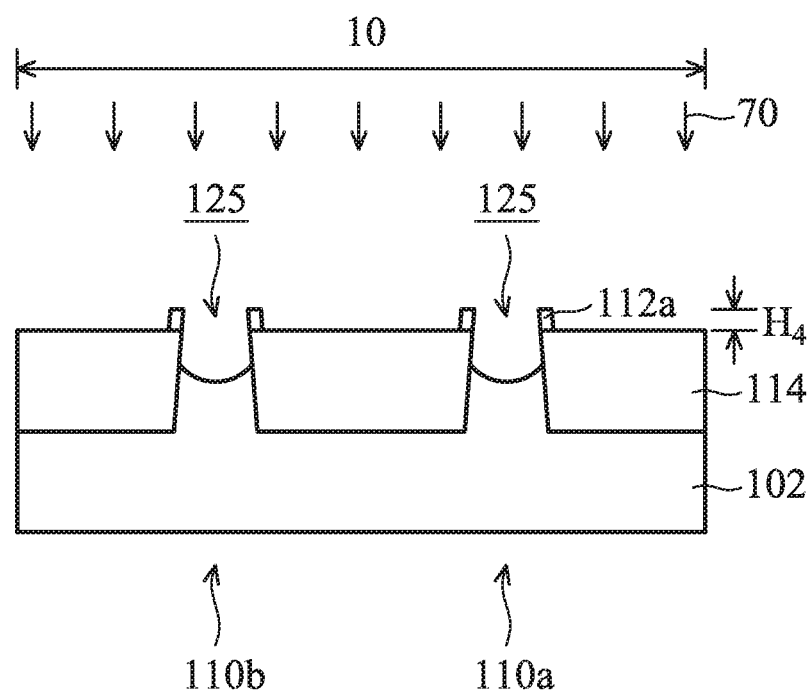

Afterwards, as shown in FIG. 6B, a portion of the first fin structure 110*a* is removed, in accordance with some embodiments of the disclosure. The portion of the first fin structure 110*a* is removed by the etching process 70. Therefore, the first recess 125 is formed in the first region 10.

After the etching process 70, the first fin spacer 112*a* is reduced to have a fourth height $H_4$ which is measured from the top surface of each of the first fin spacers 112*a* to the top surface of the isolation structure 114. The fourth height $H_4$ is smaller than the third height $H_3$. It should be noted that the second height $H_2$ of the etched second fin spacer 112*b* shown in FIG. 5B is greater than the fourth height $H_4$ of the etched first fin spacer 112*a* shown in FIG. 6B.

Figure 6C:
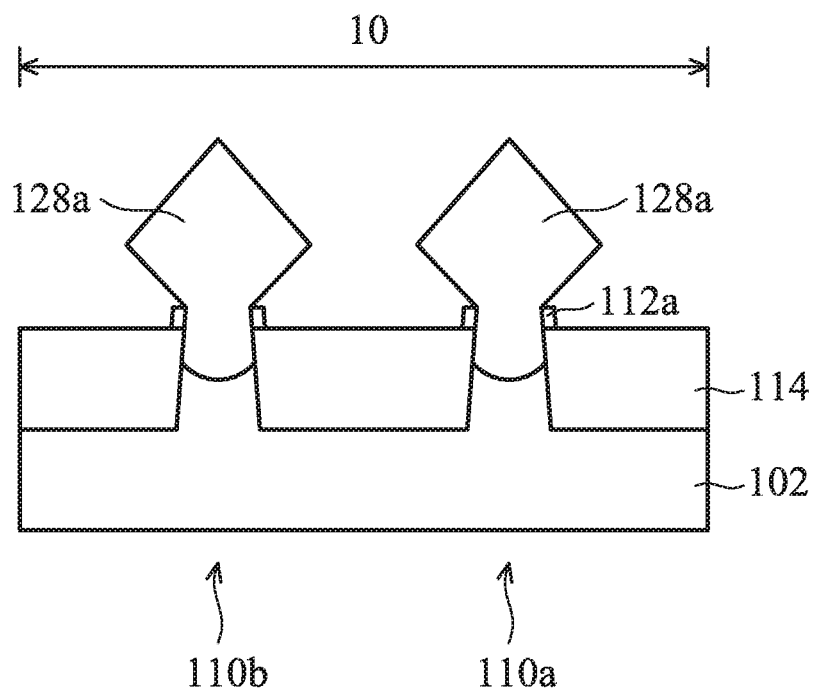
Figure 6C:
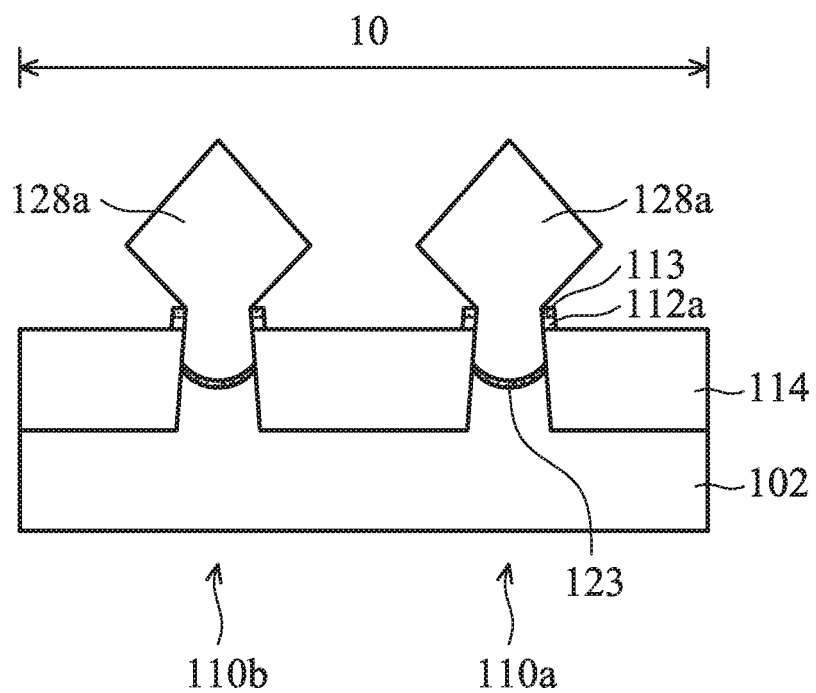

Next, as shown in FIG. 6C, the first source/drain (S/D) structure 128*a* is formed in the recess 125 in the first region 10, in accordance with some embodiments of the disclosure. Since the second height $H_2$ of the etched second fin spacer 112*b* as shown in FIG. 5B is greater than the fourth height $H_4$ of the etched first fin spacer 112*a* as shown in FIG. 6B, the volume of the second S/D structure 128*b* shown in FIG. 5C is less than the volume of the first S/D structure 128*a* shown in FIG. 6C.

FIG. 6C' shows a cross-sectional representation of the first S/D structure 128*a*, in accordance with some embodiments of the disclosure. In some other embodiments, the doped region 113 in the first fin spacer 112*a* and the doped region 123 in the first fin structure 110*a* are not removed completely, and the reminding doped region 113 is left and the reminding doped region 123 is left.

Figure 6D:
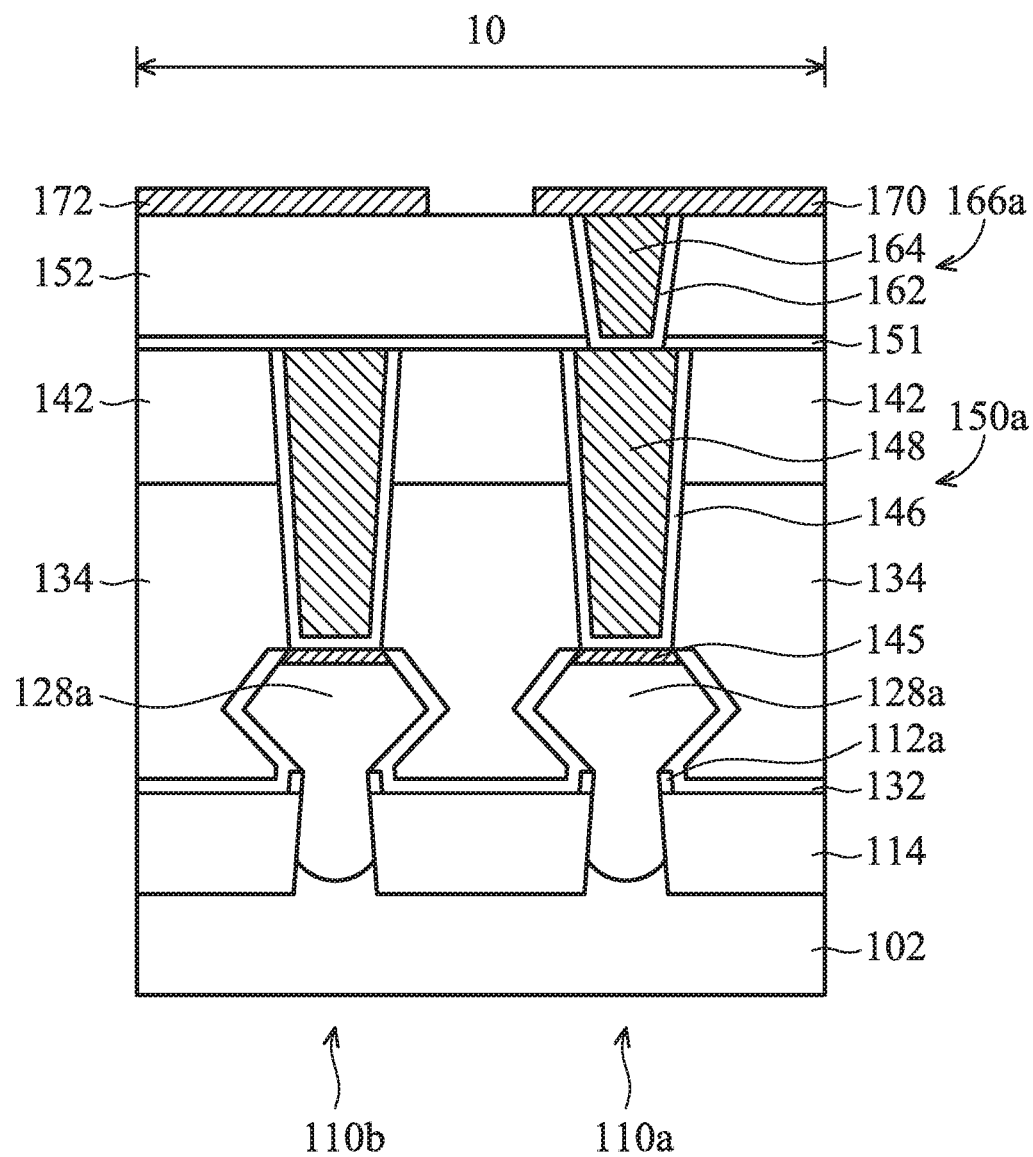

Afterwards, as shown in FIG. 6D, the CESL 132 is formed over the substrate 102 and the ILD layer 134 is formed over the CESL 132, in accordance with some embodiments of the disclosure. Afterwards, the first dielectric layer 142 is formed over the ILD layer 134. The metal silicide layer 145 is formed over the first S/D structure 128*a*, and the first S/D contact structure 150*a* is formed through the first dielectric layer 142 and the ILD layer 134 to be in direct contact with the metal silicide layer 145.

The first conductive via 166*a* is formed over the first S/D contact structure 150*a*, and the power line 170 is formed over the first conductive via 166*a*. The voltage is applied to the first conductive via 166*a* through the power line 170, and the first conductive via 166*a* is electrically connected to the S/D structure 128*a* by the S/D contact structure 150*a* and the metal silicide layer 145. It should be noted that in the first region 10 (such as pickup region), the first S/D structure 128*a* is electrically insulated from the signal line 172.

When the first region 10 is a pickup region, a high voltage (or high current) may flow through the devices in the first region 10. In order to conduct the high current, the resistance of the S/D structure should be reduced. By forming the first S/D structure 128*a* with a large volume to reduce the contact resistance between the first S/D structure 128*a* and the first S/D contact structure 150*a*. It should be noted that the first volume of the first S/D structure 128*a* in the pickup region 10 is greater than the second volume of the second S/D structure 128*b* in the non-pickup region 20. Therefore, the resistance of the first S/D structure 128*a* is effectively reduced and the performance of the FinFET device structure 100 is improved.

The large volume of the first S/D structure 128*a* can be controlled by forming a deeper first recess 125 or forming a smaller first fin spacer 112*a*. The deeper first recess 125 may be produced by doping a portion of the first fin structure 110*a*, and the doped region 123 in the first fin structure 110*a* is easily to be removed than the un-doped region. Therefore, the deeper first recess 125 (compared with the second recess 127, as shown in FIG. 3B) is used to form the first S/D structure 128*a* with a large volume. Furthermore, the volume of the S/D structure may be controlled by the height of the fin spacer. The first fin spacers 112*a* adjacent to the first S/D structure 128*a* is controlled to have a lower height compared with the second fin spacer 112*b* adjacent to the second S/D structure 128*b*. Therefore, the first S/D structure 128*a* is formed to have a large volume due to the low first fin spacers 112*a*.

Embodiments for forming a FinFET device structure and method for formation the same are provided. The FinFET device structure includes a fin structure formed over a substrate, and a gate structure formed over the fin structure. The substrate includes a first region and a second region. The first region is pickup region, and the second region is non-pickup region. A first S/D structure is formed adjacent to the gate structure in the first region, and a second S/D structure is formed adjacent to the gate structure in the second region. A power line is formed over and is electrically connected to the first S/D structure, and a signal line is formed over and is electrically connected to the second S/D structure. The power line is electrically insulated from the signal line. The first S/D structure has a greater volume than the second S/D structure to reduce the resistance of the first S/D structure. Therefore, the performance of the FinFET device structure is improved.

In some embodiments, a FinFET device structure is provided. The FinFET device structure includes a fin structure formed over a substrate, and the substrate includes a first region and a second region. The FinFET device structure also includes a gate structure formed over a fin structure and a first S/D structure formed adjacent to the gate structure. The first S/D structure is in the first region and has a first volume. The FinFET device structure also includes a second S/D structure formed adjacent to the gate structure. The second S/D structure is in the second region and has a second volume, and the second volume is lower than the first volume. The FinFET device structure includes a first contact structure formed over the first S/D structure and a first conductive via formed over the first contact structure. The FinFET device structure includes a power line formed over the first conductive via, and the power line is electrically connected to the first S/D structure by the first conductive via and the first contact structure.

In some embodiments, a FinFET device structure is provided. The FinFET device structure includes a substrate, and the substrate includes a pickup region and a non-pickup region. The FinFET device structure also includes an isolation structure formed over the substrate, a first fin structure formed over the pickup region of the substrate, and a second fin structure formed over the non-pickup region of the substrate. The FinFET device structure includes a first S/D structure formed over the first fin structure and a first fin spacer formed adjacent to the first S/D structure. The first fin spacer has a first height measured from a top surface of the first fin spacer to a top surface of the isolation structure. The FinFET device structure also includes a second S/D structure formed over the second fin structure and a second fin spacer formed adjacent to the second S/D structure. The second fin spacer has a second height measured from a top surface of the second fin spacer to a top surface of the isolation structure, and the second fin spacer is higher than the first fin spacer. The FinFET device structure also includes a first conductive via formed over the first S/D structure, and a power line formed over the first conductive via. The power line is electrically connected to the first S/D structure by the first conductive via.

In some embodiments, a method for forming a FinFET device structure is provided. The method includes forming a first fin structure and a second fin structure over a substrate. The substrate includes a first region and a second region, the first fin structure is in a first region, the second fin structure is in a second region. The method also includes removing a portion of the first fin structure to form a first recess and removing a portion of the second fin structure to form a second recess. The first recess is deeper than the second recess. The method includes forming a first S/D structure in the first recess, and the first S/D structure has a first volume. The method further includes forming a second S/D structure in the second recess, the second S/D structure has a second volume, and the first volume is greater than the second volume. The method includes forming a first S/D conductive via over the first S/D structure and forming a power line over the first conductive via. The power line is electrically connected to the first S/D structure by the first conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising:
   a fin structure formed over a substrate, wherein the substrate comprises a first region and a second region;
   a gate structure formed over a fin structure;
   a first source/drain (S/D) structure formed adjacent to the gate structure, wherein the first S/D structure is in the first region and has a first volume;
   a second S/D structure formed adjacent to the gate structure, wherein the second S/D structure is in the second region and has a second volume, and the second volume is lower than the first volume;
   a first contact structure formed over the first S/D structure;
   a first conductive via formed over the first contact structure; and
   a power line formed over the first conductive via, wherein the power line is electrically connected to the first S/D structure by the first conductive via and the first contact structure.

2. The fin field effect transistor (FinFET) device structure as claimed in claim 1, wherein the first S/D structure has a first depth below a top surface of the fin structure along a vertical direction, the second S/D structure has a second depth below the top surface of the fin structure along a vertical direction, and the first depth is greater than the second depth.

3. The fin field effect transistor (FinFET) device structure as claimed in claim 1, further comprising:
   an isolation structure formed over the substrate, wherein a bottom surface of the first S/D structure is lower than a top surface of the isolation structure.

4. The fin field effect transistor (FinFET) device structure as claimed in claim 1, further comprising:
   a second contact structure formed over the second S/D structure;
   a second conductive via formed over the second contact structure; and
   a signal line formed over the second conductive via, wherein the signal line is electrically connected to the second S/D structure by the second conductive via and the second contact structure.

5. The fin field effect transistor (FinFET) device structure as claimed in claim 1, wherein the first region is a pickup region, the second region is non-pickup region, and the first region and the second region are a part of a static random access memory (SRAM).

6. The fin field effect transistor (FinFET) device structure as claimed in claim 1, further comprising:
   a first metal silicide layer formed on the first S/D structure, wherein the first S/D structure is electrically connected to the first contact structure by the first metal silicide layer.

7. The fin field effect transistor (FinFET) device structure as claimed in claim 6, wherein a bottom surface of the first metal silicide layer is higher than a top surface of the fin structure.

8. The fin field effect transistor (FinFET) device structure as claimed in claim 1, wherein the power line is not electrically connected to the second S/D structure.

9. A fin field effect transistor (FinFET) device structure, comprising:
   a substrate, wherein the substrate comprises a pickup region and a non-pickup region;
   an isolation structure formed over the substrate;
   a first fin structure formed over the pickup region of the substrate;
   a second fin structure formed over the non-pickup region of the substrate;
   a first source/drain (S/D) structure formed over the first fin structure;
   a first fin spacer formed adjacent to the first S/D structure, wherein the first fin spacer has a first height measured from a top surface of the first fin spacer to a top surface of the isolation structure;
   a second S/D structure formed over the second fin structure;
   a second fin spacer formed adjacent to the second S/D structure, wherein the second fin spacer has a second height measured from a top surface of the second fin spacer to a top surface of the isolation structure, and the second fin spacer is higher than the first fin spacer;
   a first conductive via formed over the first S/D structure; and
   a power line formed over the first conductive via, wherein the power line is electrically connected to the first S/D structure by the first conductive via.

10. The fin field effect transistor (FinFET) device structure as claimed in claim 9, wherein the first S/D structure has a first volume, the second S/D structure has a second volume, and the first volume is greater than the second volume.

11. The fin field effect transistor (FinFET) device structure as claimed in claim 9, wherein a top portion of the first fin spacer has a doped region.

12. The fin field effect transistor (FinFET) device structure as claimed in claim 9, wherein the first fin structure has a doped region which is in direct contact with the first S/D structure.

13. The fin field effect transistor (FinFET) device structure as claimed in claim 9, further comprising:
   a first metal silicide layer formed on the first S/D structure, wherein the first S/D structure is electrically connected to the first contact structure by the first metal silicide layer.

14. The fin field effect transistor (FinFET) device structure as claimed in claim 9, further comprising:
   a second contact structure formed over the second S/D structure;
   a second conductive via formed over the second contact structure; and
   a signal line formed over the second conductive via, wherein the signal line is electrically connected to the second S/D structure by the second conductive via and the second contact structure.

15. The fin field effect transistor (FinFET) device structure as claimed in claim 14, wherein the power line is parallel to the signal line, and the power line is electrically separated from the signal line.

16. A fin field effect transistor (FinFET) device structure, comprising:
   a substrate, wherein the substrate comprises a pickup region and a non-pickup region;
   an isolation structure formed over the substrate;
   a first fin structure formed over the pickup region of the substrate, wherein a top surface of the first fin structure is lower than a top surface of the isolation structure;
   a second fin structure formed over the non-pickup region of the substrate;
   a first source/drain (S/D) structure formed over the first fin structure;
   a first fin spacer formed adjacent to the first S/D structure; and
   a doped region formed over the first fin spacer, wherein the first S/D structure extends above the first fin spacer.

17. The fin field effect transistor (FinFET) device structure as claimed in claim 16, further comprising:
   a second S/D structure formed over the second fin structure; and
   a second fin spacer formed adjacent to the second S/D structure, wherein the second fin spacer has a second height measured from a top surface of the second fin spacer to the top surface of the isolation structure, the first fin spacer has a first height measured from a top surface of the first fin spacer to the top surface of the isolation structure, and the second fin spacer is higher than the first fin spacer.

18. The fin field effect transistor (FinFET) device structure as claimed in claim 17, wherein the first S/D structure has a first volume, the second S/D structure has a second volume, and the first volume is greater than the second volume.

19. The fin field effect transistor (FinFET) device structure as claimed in claim 16, further comprising:
   a doped region between the first S/D structure and the first fin structure, and the doped region has a recessed shape.

20. The fin field effect transistor (FinFET) device structure as claimed in claim 16, further comprising:
   a power line formed over the first S/D structure, wherein the power line is electrically connected to the first S/D structure by a first S/D contact structure.

* * * * *